US012223755B2

(12) United States Patent
Kwak

(10) Patent No.: US 12,223,755 B2
(45) Date of Patent: Feb. 11, 2025

(54) ELECTRONIC DEVICE AND METHOD FOR IDENTIFYING SENTENCE INDICATED BY STROKES

(71) Applicant: SAMSUNG ELECTRONICS CO., LTD., Suwon-si (KR)

(72) Inventor: Taewon Kwak, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/135,088

(22) Filed: Apr. 14, 2023

(65) Prior Publication Data
US 2024/0020996 A1    Jan. 18, 2024

Related U.S. Application Data

(63) Continuation of application No. PCT/KR2023/004611, filed on Apr. 5, 2023.

(30) Foreign Application Priority Data

Jul. 14, 2022  (KR) .................. 10-2022-0086840
Aug. 2, 2022   (KR) .................. 10-2022-0096382

(51) Int. Cl.
*G06V 30/18*      (2022.01)
*G06F 3/04883*    (2022.01)
(Continued)

(52) U.S. Cl.
CPC ...... *G06V 30/1801* (2022.01); *G06F 3/04883* (2013.01); *G06F 40/279* (2020.01); *G06V 30/222* (2022.01)

(58) Field of Classification Search
CPC .. G06V 30/1801; G06V 30/222; G06V 30/32; G06F 3/04883; G06F 40/279; G06F 40/109; G06F 40/274
See application file for complete search history.

(56) References Cited

U.S. PATENT DOCUMENTS 9,542,094 B2    1/2017  Park et al.
10,089,389 B1 * 10/2018  Van Rotterdam ... G06F 16/3329
(Continued)

FOREIGN PATENT DOCUMENTS

JP    2007172640 A   7/2007
JP    4741977 B2     8/2011
(Continued)

OTHER PUBLICATIONS

International Search Report and Written Opinion for International Application No. PCT/KR2023/004611; International Filing Date Apr. 5, 2023; Date of Mailing Jul. 3, 2023, 10 Pages.

*Primary Examiner* — Keith D Bloomquist
(74) *Attorney, Agent, or Firm* — CANTOR COLBURN LLP

(57) ABSTRACT

A processor of an electronic device is configured to display a plurality of strokes in the display. The processor is configured to display, in response to a first input indicating selection of at least one character distinguished by the strokes, a first visual object for identifying a first sentence including the at least one character. The processor is configured to identify, in response to a second input indicating selection of the first visual object, strokes included in the first sentence among the strokes, based on a spacing between a first word including the at least one character and a second word, and moments of a plurality of words including the first word, and the second word are inputted. The processor is configured to display, in the display based on identification of the strokes included in the first sentence, a second visual object corresponding to the identified strokes among the strokes.

20 Claims, 17 Drawing Sheets

(51) Int. Cl.
*G06F 40/279* (2020.01)
*G06V 30/222* (2022.01)

(56) References Cited

U.S. PATENT DOCUMENTS

| | | | | |
|---|---|---|---|---|
| 10,848,482 | B1* | 11/2020 | Eisen | .................... G06F 40/289 |
| 11,023,661 | B2 | 6/2021 | Sun et al. | |
| 11,087,156 | B2 | 8/2021 | Zubarieva et al. | |
| 2008/0056574 | A1* | 3/2008 | Heck | ........................ H04L 67/02 |
| | | | | 382/177 |
| 2012/0137246 | A1* | 5/2012 | Pyo | ...................... G01C 21/362 |
| | | | | 715/776 |
| 2012/0229505 | A1* | 9/2012 | Kuga | ...................... G09G 5/363 |
| | | | | 345/629 |
| 2015/0073779 | A1 | 3/2015 | Ahn et al. | |
| 2015/0286886 | A1* | 10/2015 | Wimmer | ................ G06V 30/36 |
| | | | | 382/173 |
| 2016/0048318 | A1* | 2/2016 | Markiewicz | ........ G06F 3/03545 |
| | | | | 345/173 |
| 2016/0162446 | A1* | 6/2016 | Demiya | .............. G06F 3/03545 |
| | | | | 715/728 |
| 2021/0350122 | A1* | 11/2021 | Dixon | ................. G06F 3/04883 |

FOREIGN PATENT DOCUMENTS

| | | |
|---|---|---|
| JP | 5723697 B2 | 5/2015 |
| JP | 6464055 B2 | 2/2019 |
| KR | 101623213 B1 | 5/2016 |
| KR | 20160064925 A | 6/2016 |
| KR | 102075433 B1 | 2/2020 |
| KR | 102133532 B1 | 7/2020 |
| KR | 20200103236 A | 9/2020 |
| KR | 102344144 B1 | 12/2021 |
| KR | 20220003662 A | 1/2022 |
| KR | 102379660 B1 | 3/2022 |

* cited by examiner

ELECTRONIC DEVICE AND METHOD FOR IDENTIFYING SENTENCE INDICATED BY STROKES

CROSS-REFERENCE TO RELATED APPLICATION(S)

This application is a continuation of PCT International Application No. PCT/KR2023/004611, which was filed on Apr. 5, 2023, and claims priority to Korean Patent Application No. 10-2022-0096382, filed on Aug. 2, 2022, and claims priority to Korean Patent Application No. 10-2022-0086840, filed on Jul. 14, 2022, in the Korean Intellectual Property Office, the disclosure of which are incorporated by reference herein their entirety.

BACKGROUND

Technical Field

One or more embodiments relate to an electronic device and a method for identifying a sentence indicated by strokes.

Description of Related Art

An electronic device for extracting text from handwriting indicated by strokes drawn by a user is being developed. For example, the user may draw strokes indicating handwriting by moving a finger, stylus, and/or digitizer in contact with a display of the electronic device, or by moving a pointing device (e.g., a mouse) connected to the electronic device. The electronic device may identify characters such as alphabets based on the strokes. Based on identifying one or more characters, the electronic device may identify text including the one or more characters.

SUMMARY

According to an embodiment, an electronic device may comprise a display and a processor. The processor may be configured to display a plurality of strokes in the display. The processor may be configured to display, in response to a first input indicating selection of at least one character distinguished by the plurality of strokes, a first visual object for identifying a first sentence including the at least one character. The processor may be configured to identify, in response to a second input indicating selection of the first visual object, strokes included in the first sentence among the plurality of strokes, based on a spacing between a first word including the at least one character and a second word, and moments of a plurality of words including the first word, and the second word are inputted. The processor may be configured to display, in the display based on identification of the strokes included in the first sentence, a second visual object corresponding to the identified strokes among the plurality of strokes.

According to an embodiment, a method of an electronic device may comprise displaying, in a display of the electronic device, a plurality of characters. The method may comprise displaying, in response to a first input indicating selection of at least one first character among the plurality of characters, a list of functions associated with the at least one first character. The method may comprise identifying, in response to a second input indicating selection of a first function for identifying a sentence including the at least one first character that is identified based on the list, the sentence including the at least one first character among the plurality of characters. The method may comprise displaying, based on identifying of the sentence, at least one visual object in association with a plurality of second characters included in the sentence and including the at least one first character.

According to an embodiment, an electronic device may comprise a display and a processor. The processor may be configured to display, in the display, a plurality of characters. The processor may be configured to display, in response to a first input indicating selection of at least one first character among the plurality of characters, a list of functions associated with the at least one first character. The processor may be configured to identify, in response to a second input indicating selection of a first function for identifying a sentence including the at least one first character that is identified based on the list, the sentence including the at least one first character among the plurality of characters. The processor may be configured to display, based on identifying of the sentence, at least one visual object in association with a plurality of second characters included in the sentence and including the at least one first character.

According to an embodiment, a method of an electronic device may comprise displaying a plurality of strokes in a display of the electronic device. The method may comprise displaying, in response to a first input indicating selection of at least one character distinguished by the plurality of strokes, a first visual object for identifying a first sentence including the at least one character. The method may comprise identifying, in response to a second input indicating selection of the first visual object, strokes included in the first sentence among the plurality of strokes, based on a spacing between a first word including the at least one character and a second word, and moments of a plurality of words including the first word, and the second word are inputted. The method may comprise displaying, in the display based on identification of the strokes included in the first sentence, a second visual object corresponding to the identified strokes among the plurality of strokes.

DETAILED DESCRIPTION

Figure 1:
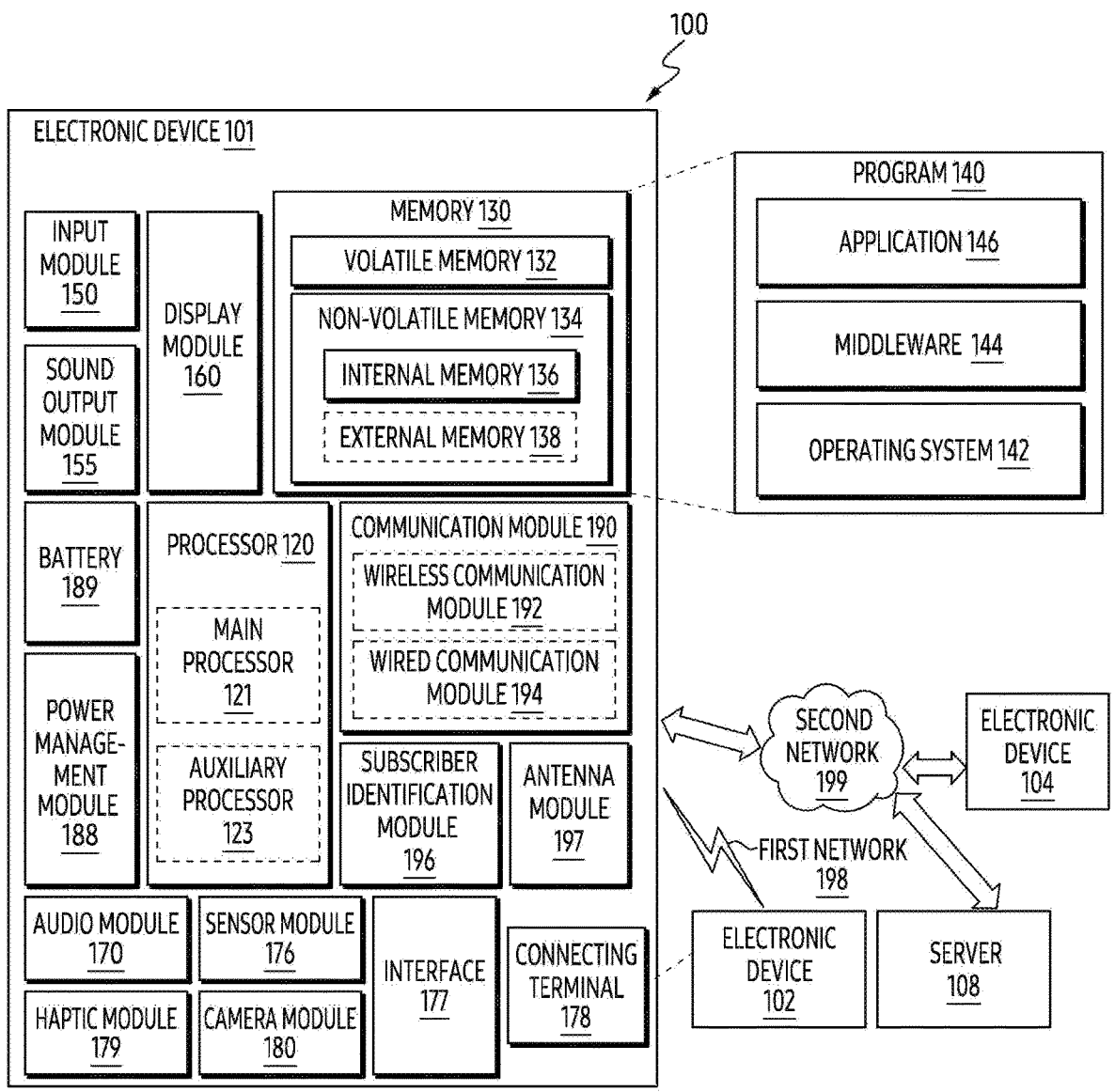
FIG. 1 is a block diagram of an electronic device according to an embodiment.

Hereinafter, various embodiments of the present document will be described with reference to the accompanying drawings.

The various embodiments and terms used herein are not intended to limit the technical features described herein to specific embodiments and should be understood to include various modifications, equivalents, or substitutes of the embodiment. With respect to the description of the drawings, similar reference numerals may be used for similar or related components. The singular form of the noun corresponding to the item may include one or more of the items unless clearly indicated differently in a related context. In this document, each of the phrases such as "A or B", "at least one of A and B", "at least one of A, B and C", "at least one of A, B, or C", and "at least one of A, B, or C" may include any one of the phrases together, or all possible combinations thereof. Terms such as "the first", "the second", or "first", or "second" may be used simply to distinguish a corresponding component from another corresponding component, and are not limited to other aspects (e.g., importance or order). When some (e.g., the first) component is referred to as "coupled" or "connected" in another (e.g., the second) component, with or without the term "functional" or "communicatively", it means that some of the components can be connected directly (e.g., wired), wirelessly, or through a third component.

The term "module" used in various embodiments of the present document may include a unit implemented in hardware, software, or firmware and be used interchangeably with terms such as logic, logic block, component, or circuitry, for example. The module may be a minimum unit or a part of the integrally configured component or the component that performs one or more functions. For example, according to an embodiment, the module may be implemented in the form of an application-specific integrated circuit (ASIC).

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
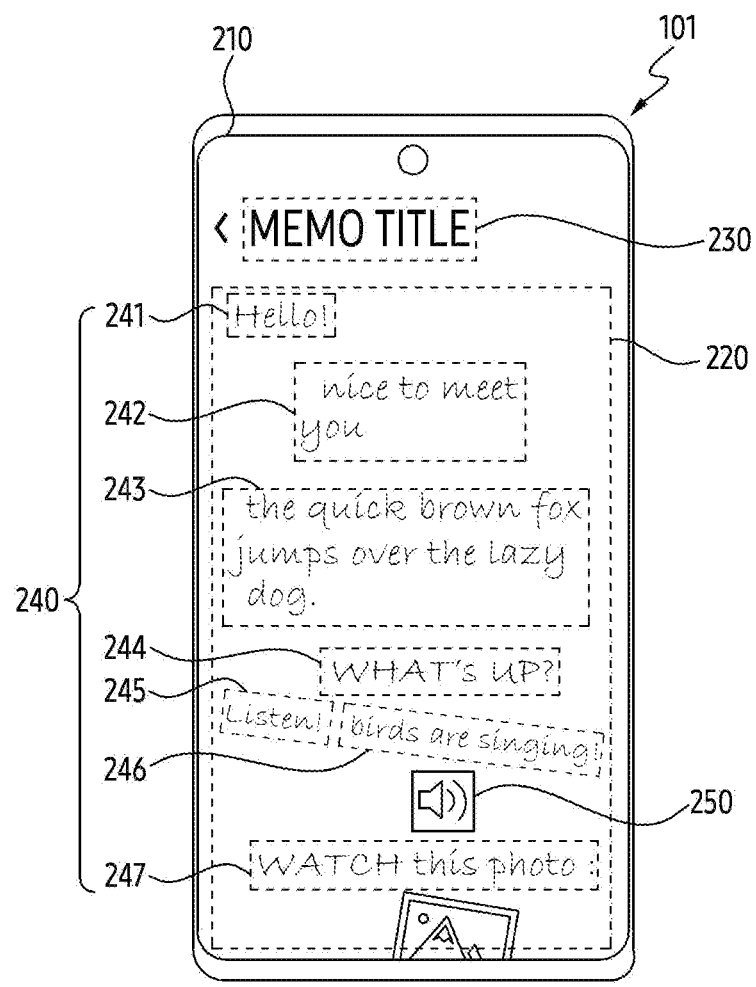
FIG. 2 illustrates an example in which an electronic device displays a plurality of strokes for indicating handwriting, according to an embodiment.

FIG. 2 illustrates an example in which an electronic device displays a plurality of strokes for indicating handwriting, according to an embodiment. Referring to FIG. 2, the electronic device 101 may be a terminal owned by a user. For example, the terminal may include a personal computer (PC), a smartphone, a smartpad, a tablet PC, a smartwatch, and smart accessories such as a head-mounted device (HMD).

According to an embodiment, the electronic device 101 may include a display 210. According to an embodiment, the electronic device 101 may visualize handwriting by using the display 210. An example of hardware and/or software included in the electronic device 101 to visualize handwriting will be described with reference to FIG. 3. The handwriting may include one or more lines drawn on one surface by the user to deliver a linguistic meaning. Hereinafter, the one or more lines included in the handwriting may be referred to as a stroke.

According to an embodiment, the electronic device 101 may obtain information on a plurality of strokes included in the handwriting by digitally converting analog handwriting. The information may include a location and/or sequence of each of the plurality of strokes. For example, the electronic device 101 may receive an input indicating the plurality of strokes based on a pointing device such as a fingertip, a stylus, a digitizer in contact with the display 210, and/or a mouse for adjusting a location of a cursor. For example, a stroke may be a trajectory and/or a path dragged by an input tool while the input tool such as the fingertip, the stylus, and/or the digitizer is in contact with the display 210. For example, a stroke may be a trajectory and/or a path of a cursor and/or a mouse pointer in the display 210 by the pointing device connected to electronic device 101. According to an embodiment, an operation in which the electronic device 101 obtains the information and media content including the information based on a user's gesture of drawing a plurality of strokes will be described with reference to FIG. 4.

In an embodiment, the media content may include information generated based on an interaction between a user and the electronic device 101. The media content may include information for reconstructing a handwriting, text, image, video, and/or audio received from the user. In an embodiment, the media content may be referred to as a document and/or a memo. For example, information indicating one or more strokes drawn by the user may be included in the media content. For example, an image, video, and/or audio embedded by the user may be included in the media content. In a state of reconstructing media content including audio, the electronic device 101 may display a visual object for reproducing the audio in the media content, such as icon 250. Reconstructing media content may include visualizing information included in the media content within the display 210 by the electronic device 101.

Referring to FIG. 2, according to an embodiment, an example of a state in which the electronic device 101 visualizes media content in the display 210 is illustrated. The electronic device 101 may display at least a part of media content in an area 220 of the display 210. The electronic device 101 may display a name and/or title assigned to the media content in an area 230 of the display 210. The electronic device 101 may display strokes included in the media content in the area 220. For example, information included in the media content and indicating moments and/or locations to which each of the strokes is inputted, the electronic device 101 may display the strokes in the area 220. The moment of a stroke corresponds to the instance in time in which the stoke is made on the electronic device 101. Each of the strokes having discernable moments that identify the respective times (e.g., a timestamp) at which a respective stroke is input to the electronic device 101. Further, moments for the strokes denote the respective times at which the strokes are input by a user to the electronic device 101. In one or more embodiments, the moments for inputting the strokes can be in a time sequential order.

According to an embodiment, the electronic device 101 may identify a character, a word, and/or a sentence 240 distinguished by the strokes. In an embodiment, a character identified by the electronic device 101 may include an alphabet, a number, and/or a sign distinguished by one or more strokes. In an embodiment, word (or vocabulary) may include a set of one or more characters with a meaning. The word may be distinguished by a spacing. In an embodiment, the sentence may include a set of one or more words indicating meaningful content. The sentence may be distinguished by a punctuation mark (e.g., a period, an exclamation mark, and/or a question mark). According to an embodiment, an operation of the electronic device 101 identifying a sentence, a word, and/or a sentence from the media content illustrated in FIG. 2 will be described with reference to FIG. 5.

Referring to FIG. 2, according to an embodiment, sentences 241, 242, 243, 244, 245, 246, and 247 are illustrated as examples of the sentence 240 identified by the electronic device 101. According to an embodiment, the electronic device 101 may identify words distinguished by a plurality of strokes included in the media content to identify sentences 241, 242, 243, 244, 245, 246, and 247 from the media content. The electronic device 101 may identify sentences 241, 242, 243, 244, 245, 246, and 247 from the media content using the locations of the words and/or moments to which the words are inputted. According to an embodiment, an operation of the electronic device 101 identifying the sentences 241, 242, 243, 244, 245, 246, and 247 based on the location and/or moments will be described with reference to FIGS. 6 to 7.

According to an embodiment, in a state in which at least a part of the media content is displayed in the area 220, the electronic device 101 may receive an input from the user indicating that the character, word, and/or sentence is selected. For example, in response to a first input indicating that a character is selected, the electronic device 101 may identify or select at least one character including at least one stroke identified by the first input. The electronic device 101 may display a visual object for indicating that the at least one character is selected by the first input in the display 210. For example, in response to a second input indicating that word and/or line is selected, the electronic device 101 may identify at least one word including at least one stroke selected by the second input, or a line on which the at least one word is displayed. The electronic device 101 may display at least one word identified by the second input and/or a visual object for highlighting the identified line in the display 210.

According to an embodiment, in response to a third input indicating that a sentence is selected, the electronic device 101 may identify a sentence including at least one stroke selected by the third input. The electronic device 101 may display a visual object for highlighting the sentence identified by the third input in the display 210. Referring to FIG. 2, based on receiving the third input on a point of the display 210 in which the word "UP" in the sentence 244 is displayed, the electronic device 101 may display a visual object for highlighting the sentence 244 more than the other sentences 241, 242, 243, 245, 246, and 247. According to an embodiment, the electronic device 101 may identify the sentence 244 corresponding to the third input based on locations of the strokes in the media content and/or moments in which the strokes are inputted. According to an embodiment, an operation in which the electronic device 101 identifies a character, word, and/or sentence based on an input received from a user will be described with reference to FIGS. 8A to 8C, 9A to 9B, and/or 10.

As described above, according to an embodiment, in a state of visualizing handwriting based on a plurality of strokes, the electronic device 101 may receive an input for selecting a character, word, and/or sentence distinguished by the plurality of strokes. For example, in response to an input indicating that the sentence is selected, the electronic device 101 may obtain spacings between words distinguished by the plurality of strokes and moments to which the words are inputted. Based on the spacings and moments, the electronic device 101 may identify a sentence including at least one stroke selected by the input from among the plurality of strokes. The electronic device 101 may highlight the identified sentence more than another sentence different from the identified sentence, from among the sentences distinguished by the plurality of strokes. By highlighting the identified sentence, the electronic device 101 may indicate that the identified sentence is selected based on the input.

Hereinafter, an example of one or more hardware included in the electronic device 101 according to an embodiment will be described with reference to FIG. 3.

Figure 3:
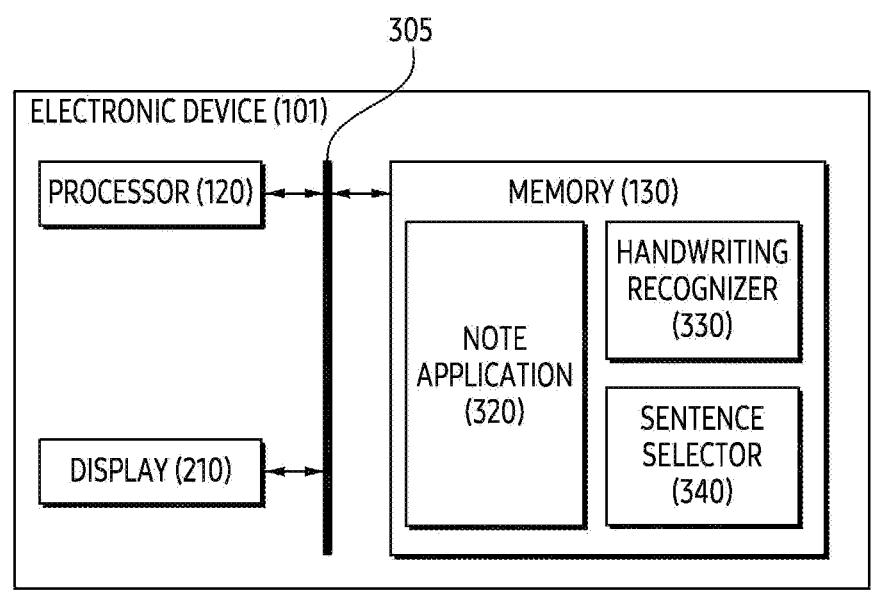
FIG. 3 illustrates an example of one or more programs executed by an electronic device to identify at least one sentence from a plurality of strokes, according to an embodiment.

FIG. 3 illustrates an example of one or more programs executed by an electronic device 101 to identify at least one sentence from a plurality of strokes, according to an embodiment. The electronic device 101 of FIG. 3 may be an example of the electronic device 101 of FIGS. 1 to 2. For example, the electronic device 101 and the display 210 of FIG. 2 may include the electronic device 101 and the display 210 of FIG. 3.

Referring to FIG. 3, according to an embodiment, the electronic device 101 may include at least one of a processor 120, a memory 130, and a display 210. The processor 120, the memory 130, and the display 210 may be electronically and/or operably coupled with each other by electronic components such as a communication bus 305. Hereinafter, operatively coupled hardware may mean that a direct connection or indirect connection between hardware is established wired or wirelessly to ensure that the first of the hardware is controlled by the second hardware. Although illustrated based on different blocks, the embodiment is not limited thereto, and a portion of the hardware (e.g., at least a part of the processor 120 and the memory 130) illustrated in FIG. 3 may be included in a single integrated circuit like a system on a chip (SoC). The type and/or number of hardware included in the electronic device 101 is not limited as shown in FIG. 3. For example, the electronic device 101 may include only a part of the hardware shown in FIG. 3.

According to an embodiment, the processor 120 of electronic device 101 may include a circuit for processing data based on one or more instructions. For example, the hardware component for processing data may include an arithmetic and logic unit (ALU), a floating point unit (FPU), a field programmable gate array (FPGA), and/or a central processing unit (CPU). The number of the processors 120 may be one or more. For example, the processor 120 may have a structure of a multi-core processor such as a dual core, a quad core, or a hexa core. The processor 120 of FIG. 3 may include the processor 120 of FIG. 1.

According to an embodiment, the memory 130 of the electronic device 101 may include a hardware for storing data and/or instructions input and/or output to and from the processor 120. For example, the memory 130 may include a volatile memory such as random-access memory (RAM) and/or a non-volatile memory such as read-only memory (ROM). For example, the volatile memory may include at least one of dynamic RAM (DRAM), static RAM (SRAM), Cache RAM, or pseudo SRAM (PSRAM). For example, the nonvolatile memory may include at least one of programmable ROM (PROM), erasable PROM (EPROM), electrically erasable PROM (EEPROM), flash memory, hard disk, compact disk, or embedded multi-media card (eMMC). The memory 130 of FIG. 3 may include the memory 130 of FIG. 1.

According to an embodiment, the display 210 of the electronic device 101 may output visualized information (e.g., as depicted on at least one of screens of FIGS. 4, 8A to 8C, 9A to 9B, and/or 10) to a user. For example, the display 210 may be controlled by the processor 120 and output visualized information to the user. The display 210 may include a flat panel display (FPD) and/or an electronic paper. The FPD may include a liquid crystal display (LCD), a plasma display panel (PDP), and/or one or more light emitting LEDs. The LED may include an organic LED (OLED).

According to an embodiment, the display 210 of the electronic device 101 may include a sensor (e.g., a touch sensor panel (TSP)) for detecting an external object (e.g., a user's finger) on the display 210. For example, the electronic device 101 may detect an external object in contact with the display 210 or floating on the display 210, based on the TSP. In response to detecting the external object, the electronic device 101 may execute a function related to a specific visual object corresponding to the position of the external object on the display 210 among the visual objects displayed in the display 210.

According to an embodiment, one or more instructions indicating a calculation and/or an operation to be performed on data by the processor 120 may be stored in the memory 130. A set of one or more instructions may be referred to as firmware, operating system, process, routine, sub-routine, and/or application. For example, when a set of a plurality of instructions deployed in the form of operating system, firmware, driver, and/or application is executed, the electronic device 101 and/or the processor 120 may perform at least one of the operations of FIGS. 11 to 13. Hereinafter, the fact that the application is installed in the electronic device 101 may indicate that one or more instructions provided in the form of the application are stored in the memory 130 of the electronic device 101, and mean that the one or more applications are stored in an executable format (e.g., a file having an extension designated by the operating system of the electronic device 101) by the processor 120 of the electronic device 101.

Referring to FIG. 3, according to an embodiment, a note application 320, a handwriting recognizer 330, and a sentence selector 340 are illustrated as examples of applications stored in the memory 130. The note application 320 of FIG. 3 may be an application software for displaying a user interface (UI) for executing a function related to handwriting in the display 210. The handwriting recognizer 330 and/or the sentence selector 340 of FIG. 3 may be software for obtaining text from one or more strokes for indicating handwriting. Although illustrated based on different blocks, the embodiment is not limited thereto. For example, the handwriting recognizer 330 and the sentence selector 340 may be included in the note application 320. The handwriting recognizer 330 and the sentence selector 340 may be executed in a second state different from a first state shown to the user, such as a background process and/or a daemon.

According to an embodiment, the processor 120 in the electronic device 101 may display media content including one or more strokes representing handwriting based on execution of the note application 320. For example, the electronic device 101 may display an area 220 in which at least a part of the media content of FIG. 2 is displayed based on the execution of the note application 320. According to an embodiment, the electronic device 101 may receive an input for executing a function related to handwriting recognition from a user, by using the note application 320.

In an embodiment, handwriting recognition may include a function of identifying text including a character, word, and/or sentence from one or more strokes. Based on handwriting recognition, one or more strokes drawn by the user may be converted into readable information by the electronic device 101. For example, a text identified by the electronic device 101 from one or more strokes based on handwriting recognition may include information encoded based on a plurality of bits, such as Unicode and/or American standard code for information interchange (ASCII) code. According to an embodiment, the electronic device 101 may execute the handwriting recognizer 330 and/or the sentence selector 340 based on an input received through the note application 320 and indicating that text is extracted from the strokes. For example, the handwriting recognizer 330 and/or the sentence selector 340 may be executed based on an input indicating that a function such as handwriting recognition is executed.

According to an embodiment, the electronic device 101 may control an operation of the electronic device 101 related to handwriting recognition based on the execution of the handwriting recognizer 330. For example, the electronic device 101 may call functions and/or events supported by the handwriting recognizer 330 based on an input received from a user through the note application 320. For example, functions supported by the handwriting recognizer 330 may include a function of identifying a plurality of words by grouping a plurality of strokes included in media content. The function of identifying a plurality of words may include storing information corresponding to each of the plurality of words in the memory 130 based on a data structure such as a connection list. For example, the connection list to which nodes corresponding to each of the words distinguished or divided by different strokes are connected may be referred to as a word list. The function of identifying a plurality of words may include storing a list of words distinguished by a direction and/or line in which the plurality of words are arranged, in the memory 130. The list of the words distinguished by the line may be referred to as a line list. The function of identifying a plurality of words may include storing a list of moments to which the plurality of words are inputted, in the memory 130. The list of moments may be referred to as a time list.

According to an embodiment, the electronic device 101 may identify one or more sentences included in media content by using the sentence selector 340. The electronic device 101 may identify, based on the execution of the sentence selector 340, the one or more sentences, and the electronic device 101 may identify based on the word list, the line list and/or the time list stored in the memory 130 by execution of the handwriting recognizer 330. For example, the electronic device 101 may obtain spatial information of one or more words in the media content based on the word list and/or the line list by using the sentence selector 340. For example, the electronic device 101 may obtain temporal information including moments in which one or more words are inputted and/or a sequence in which the one or more words are inputted, in the media content, based on the time list by using the sentence selector 340. According to an embodiment, based on the execution of the sentence selector 340, the electronic device 101 may identify one or more sentences included in the media content by grouping one or more words based on the spatial information and the temporal information. According to an embodiment, an operation in which the electronic device 101 identifies one or more sentences based on the spatial information and the temporal information based on the sentence selector 340 will be described with reference to FIG. 7.

In an embodiment, the result of identifying a sentence based on the execution of the sentence selector 340 may include information indicating a location of the sentence in the media content. The information may be stored together with the media content or may be stored in metadata corresponding to the media content. According to an embodiment, the electronic device 101 may display a visual object for indicating at least one sentence in the media content based on the information obtained by identifying at least one sentence using the sentence selector 340. For example, the information may represent a rectangle overlapping a part where the sentence is arranged within the media content, based on a rectangular (rect) data structure. The rectangular data structure may include four integers and/or floating point numbers, where the four integers and/or floating point numbers represent an x-coordinate and a y-coordinate of one corner of the rectangle, along with the width and the height of the rectangle. The embodiment is not limited thereto, and the electronic device 101 may store one or more sentences identified by the sentence selector 340 based on another data structure different from the rectangular data structure. For example, based on a combination of nodes included in the word list, the electronic device 101 may store a result of identifying one or more sentences by the sentence selector 340.

As described above, according to an embodiment, the electronic device 101 may receive an input for recognizing handwriting represented by a plurality of strokes in the media content. Displaying media content by the electronic device 101 may be performed based on the execution of the note application 320. In response to the input, the electronic device 101 may identify a plurality of words from the plurality of strokes based on the execution of the handwriting recognizer 330. The electronic device 101 may identify at least one sentence from the plurality of words based on the execution of the sentence selector 340. According to an embodiment, the electronic device 101 may improve a user experience related to handwriting recognition by identifying or visualizing at least one sentence identified by the user. For example, the electronic device 101 may support the identification of strokes displayed in the display 210 in units of sentences identified by the sentence selector 340.

Hereinafter, referring to FIG. 4, according to an embodiment, an example of an operation in which the electronic device 101 receives media content from a user will be described.

Figure 4:
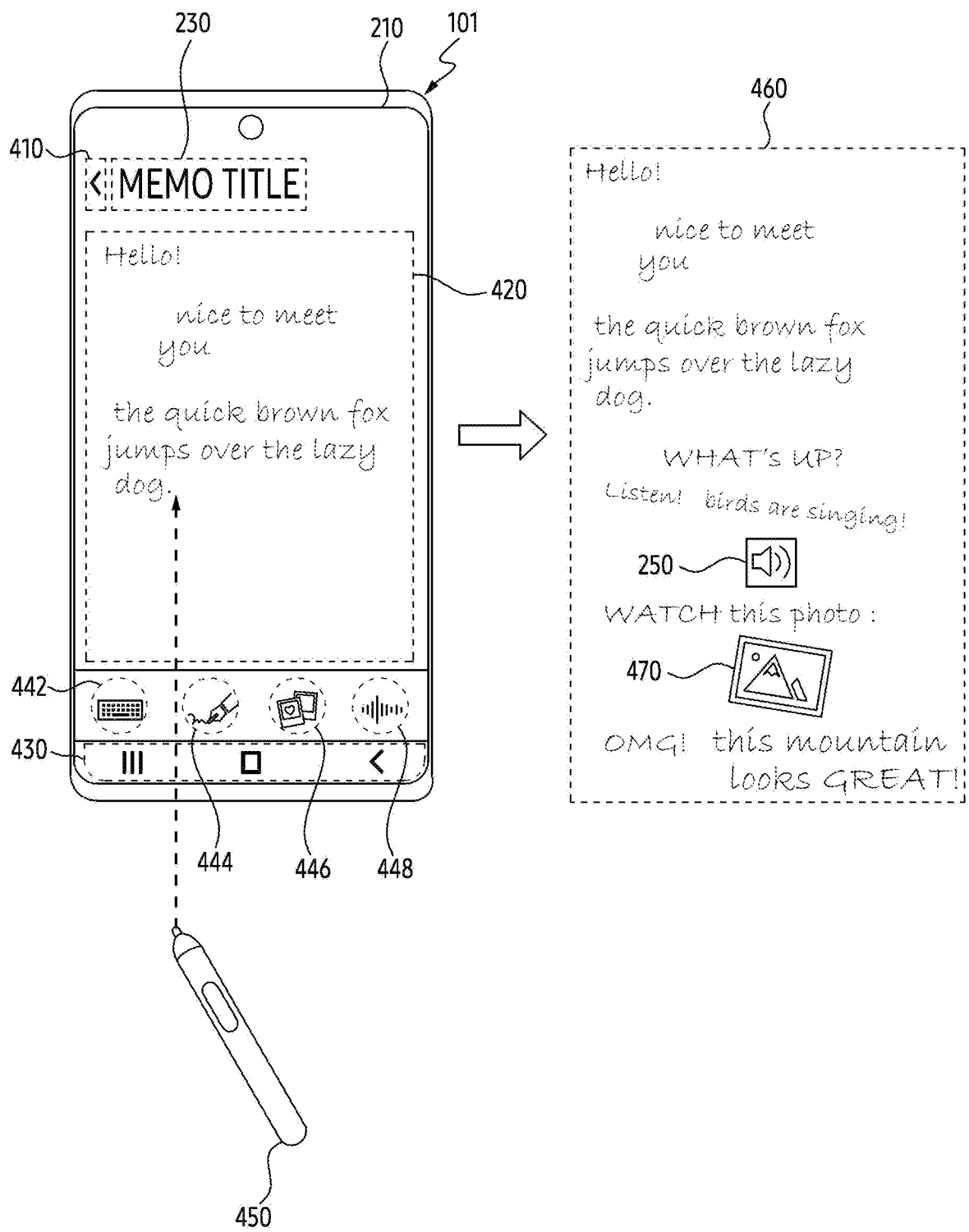
FIG. 4 illustrates an example of an operation in which an electronic device obtains media content including at least one stroke based on an interaction between a user and an electronic device, according to an embodiment.

FIG. 4 illustrates an example of an operation in which an electronic device 101 obtains media content 460 including at least one stroke based on an interaction between a user and the electronic device 101, according to an embodiment. The electronic device 101 of FIG. 4 may be an example of the electronic device 101 of FIGS. 1 to 3. For example, the electronic device 101 and the display 210 of FIG. 3 may include the electronic device 101 and the display 210 of FIG. 4. Hereinafter, the screen may mean a user interface (UI) displayed within at least a part of the display. For example, the screen may include the activity of an Android operating system for explanation purposes but can apply by analogy to any other operating system for an electronic device having a display. The screen of FIG. 4 may be an example of a screen displayed in the display 210 by the electronic device 101 based on the execution of the note application 320 of FIG. 3.

Referring to FIG. 4, according to an embodiment, an example of a screen displayed by the electronic device 101 based on the execution of an application (e.g., the note application 320 of FIG. 3) for outputting the media content 460 is illustrated. In an area 410 of the screen, the electronic device 101 may display a button for switching to another screen connected to the screen of FIG. 4 by the application for outputting the media content 460. In the area 230 of the screen, the electronic device 101 may display text corresponding to the title of the media content 460, similar to the area 230 of FIG. 2. In an area 430 of the screen, the electronic device 101 may display at least one visual object for switching from the application in an active state to another application. For example, in the area 430 of the screen, the electronic device 101 may display at least one of home buttons for executing the launcher application, a switching button for executing a function related to multitasking based on a list of one or more applications being executed by the electronic device 101, and a back button for returning to another screen that was displayed before one screen displayed in the display 210. A part of the screen on which the area 430 is displayed by the electronic device 101 may be referred to as a lower end of the screen.

Referring to FIG. 4, the electronic device 101 may display at least a part of the media content 460 in the area 420 of the screen, similar to the area 220 of FIG. 2. Based on a gesture performed by an external object (e.g., fingertip) touching a part of the display 210 on which area 420 is displayed, the electronic device 101 may change at least a part of the media content 460 displayed in the area 420. For example, in response to a drag gesture and/or a swipe gesture performed within the area 420, the electronic device 101 may scroll the media content 460 displayed in the area 420 based on a direction of the drag gesture and/or the swipe gesture. For example, in response to a pinch-to-zoom gesture performed within the area 420, the electronic device 101 may adjust the magnification of the media content 460 displayed in the area 420 based on a direction of the pinch-to-zoom gesture.

According to an embodiment, the electronic device 101 may display visual objects 442, 444, 446, and 448 for generating and/or editing the media content 460 displayed in the area 420. Referring to FIG. 4, an example in which the electronic device 101 displays the visual objects 442, 444, 446, and 448 in another area different from the area 420 is illustrated, but an embodiment is not limited thereto. For example, the electronic device 101 may display at least one of the visual objects 442, 444, 446, and 448 by at least partially overlapping the area 420. Unlike an embodiment of FIG. 4, in which all of the visual objects 442, 444, 446, and 448 are displayed, the electronic device 101 may selectively display at least one of the visual objects 442, 444, 446, and 448.

Based on the visual objects 442, 444, 446, and 448, the electronic device 101 may receive different inputs for editing the media content 460. For example, the visual object 442 may correspond to a function for editing text inputted in the media content 460 or adding text in the media content 460. In response to an input indicating that the visual object 442 is selected, the electronic device 101 may display a software keyboard within at least a part of the display 210. Based on the touch input performed within the software keyboard, the electronic device 101 may add text indicated by the touch input to a part of the media content 460 (e.g., a part where a cursor is displayed). For example, the visual object 446 may correspond to a function for adding multimedia content (e.g., image and/or video) such as an image 470 into the media content 460. In response to an input indicating that the visual object 446 is selected, the electronic device 101 may execute another application for browsing the multimedia content stored in the memory (e.g., the memory 130 of FIG. 2) of the electronic device 101 such as a gallery application, or still another application for obtaining a video and/or an image from the camera (e.g., the camera module 180 of FIG. 1) of the electronic device 101 such as a camera application. For example, the visual object 448 may correspond to a function for adding audio (e.g., the audio represented by the icon 250) within the media content 460. In response to an input indicating that the visual object 448 is selected, the electronic device 101 may initiate obtaining an audio signal by using a microphone.

Referring to FIG. 4, the electronic device 101 may display a visual object 444 corresponding to a function for receiving an image and/or handwriting based on an external object (e.g., a fingertip, and/or the pen 450) in contact with the display 210. The pen 450 may include an external electronic device for controlling the electronic device 101 based on contact between the display 210 and the pen 450, such as a digitizer and/or stylus. The electronic device 101 may identify at least one of the position of the pen 450 in contact with the display 210, the pressure of the pen 450 pressing the display 210, and/or the angle between the display 210 and the pen 450. In an embodiment, a communication link may be established between the electronic device 101 and the pen 450 to identify at least one of the position, the pressure, and/or the angle. However, the embodiment is not limited thereto.

According to an embodiment, the electronic device 101 may receive an input for generating or editing the media content 460 based on the visual objects 442, 444, 446, and 448. Referring to FIG. 4, an example of the media content 460 obtained by the electronic device 101 from a user based on the input is illustrated. The electronic device 101 may identify a stroke drawn by a user based on a single contact between the pen 450 and the display 210. Based on the user sequentially drawing a plurality of strokes, the electronic device 101 may display handwriting based on the plurality of strokes drawn by the user in the area 420. Referring to FIG. 4, the media content 460 may include an example of handwriting based on sequentially drawing the plurality of strokes in the area 420. According to an embodiment, the electronic device 101 may store at least one of moments at which each of the plurality of strokes is inputted, timestamps, and/or indexes, as well as a position at which each of the plurality of strokes is drawn in the media content 460.

As described above, according to an embodiment, the electronic device 101 may identify a plurality of strokes for representing handwriting from the user based on an external object such as the pen 450 and/or a user's finger. The electronic device 101 may store a result of identifying the plurality of strokes in the media content 460. In a state in which the media content 460 is displayed, the electronic device 101 may extract a character, word, and/or sentence distinguished by the plurality of strokes.

Hereinafter, referring to FIG. 5, according to an embodiment, an operation in which an electronic device 101 identifies a plurality of strokes included in the media content 460 will be described.

Figure 5:
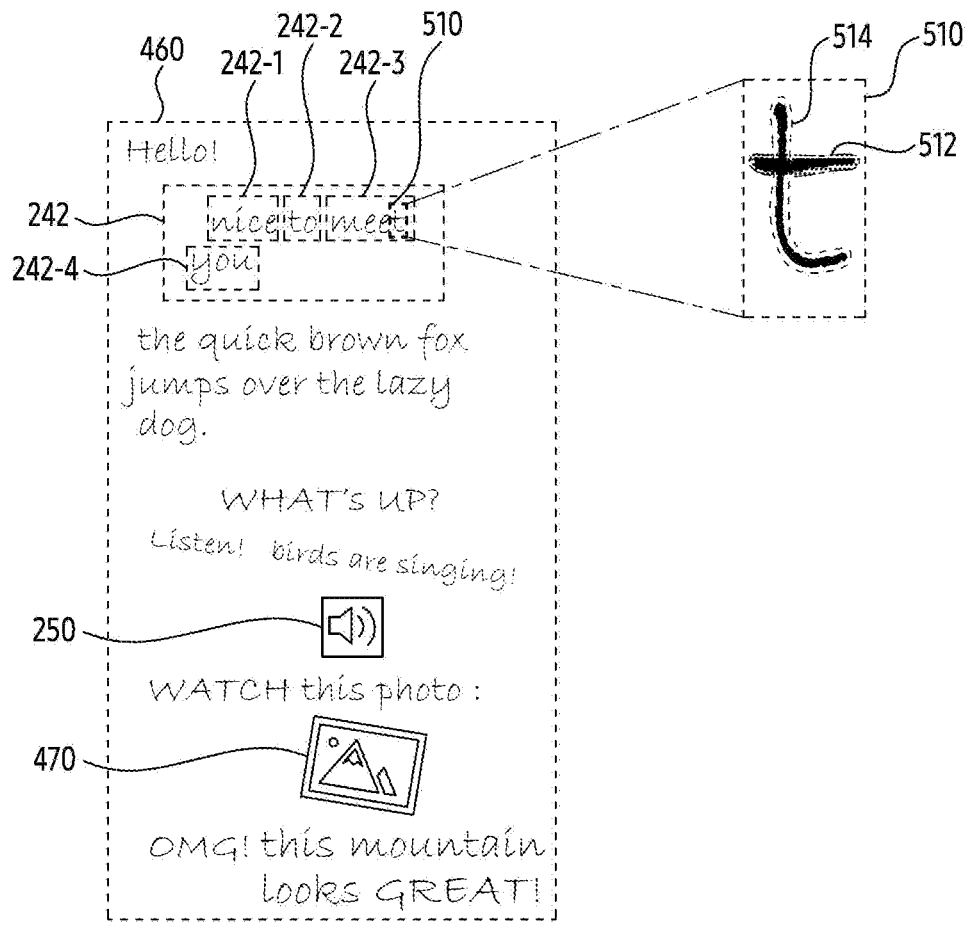
FIG. 5 illustrates an example of a word, a character, and/or a sentence identified by an electronic device from a plurality of strokes, according to an embodiment.

FIG. 5 illustrates an example of a word, a character, and/or a sentence identified by an electronic device from a plurality of strokes, according to an embodiment. The electronic device of FIG. 5 may be an example of the electronic device 101 of FIGS. 1 to 4. For example, the electronic device 101 of FIG. 3 may include the electronic device of FIG. 5. The media content 460 of FIG. 5 may correspond to the media content 460 of FIG. 4.

Referring to FIG. 5, the media content 460 obtained by the electronic device based on strokes drawn by the user is exemplarily illustrated. For example, after selecting the visual object 444 in FIG. 4, the user may draw a stroke indicating handwriting by using a pen (e.g., the pen 450 in FIG. 4). While the user draws the stroke, the electronic device may obtain a list of one or more dots for reconstructing the stroke based on at least one pixel in the display (e.g., the display 210 of FIG. 3) in which the pen is in contact. For example, the electronic device may obtain the list of dots by connecting nodes corresponding to each of dots included in the stroke. Each of the nodes may include at least one of a position of a corresponding dot and/or a moment (e.g., a timestamp based on milliseconds) in which the dot is drawn by the pen. The electronic device may store the list of dots in the media content 460.

According to an embodiment, the electronic device may identify at least one stroke from the media content 460. Referring to FIG. 5, strokes 512 and 514 identified by the electronic device from the media content 460 are exemplarily illustrated. Each of the strokes 512 and 514 may be identified based on a single contact between the pen (e.g., the pen 450 of FIG. 4) and the electronic device while media content 460 is generated. According to an embodiment, the electronic device may display the stroke 512 based on a list of dots corresponding to the stroke 512. For example, the electronic device may display dots included in the list in a display (e.g., the display 210 of FIG. 3), and display the stroke 512 by displaying other dots based on the interpolation of the dots and/or lines. Displaying the stroke 514 in the media content 460 by the electronic device may be performed similarly to the above-described operation of displaying the stroke 512.

According to an embodiment, the electronic device may identify the character 510 including the strokes 512 and 514 based on the position and/or the sequence in which the strokes 512 and 514 are drawn. Identifying the character 510 by the electronic device may include identifying an alphabet (e.g., "t" in the case of the character 510 of FIG. 4) represented by the combination of the strokes 512 and 514. According to an embodiment, the electronic device may identify a plurality of characters including the character 510 from a plurality of strokes included in the media content 460. For example, the plurality of strokes may be grouped into different characters.

According to an embodiment, the electronic device may identify a word from a plurality of characters including the character 510 within the media content 460. Referring to FIG. 5, words 242-1, 242-2, 242-3, and 242-4 identified by the electronic device from the media content 460 are exemplarily illustrated. For example, the electronic device may identify a spacing for distinguishing a word in the media content 460 based on a spacing between the characters within the media content 460. Based on the spacing for distinguishing a word in the media content 460, the electronic device may identify a word from a plurality of characters. For example, similar to a plurality of strokes grouped into different characters, characters identified from a plurality of strokes in the media content 460 may be grouped into different words.

According to an embodiment, the electronic device may identify positions in the media content 460 of a plurality of words identified from a plurality of strokes in the media content 460 and/or moments in which the plurality of words are inputted. For example, the electronic device may obtain coordinates in the media content 460 of each of a plurality of words. The coordinates may be a representative value (e.g., minimum value, maximum value, average value, and/or intermediate value) of coordinates in the media content 460 of strokes included in the corresponding word. For example, the electronic device may obtain timestamps indicating moments in which each of the plurality of words is inputted. The moment to which word is inputted may be a representative value (e.g., minimum value, maximum value, average value, and/or intermediate value) of timestamps assigned to each of the dots included in the strokes included in the word. The moment to which word is inputted may include an index indicating the position of the word within a sequence of the plurality of words.

According to an embodiment, the electronic device may identify at least one sentence based on words identified by grouping a plurality of strokes. Referring to FIG. 5, the electronic device may identify a sentence 242 distinguished by words 242-1, 242-2, 242-3, and 242-4. The electronic device may identify a plurality of sentences including the sentence 242 in the media content 460 based on spacing between words included in the media content 460 and moments in which the words are inputted.

Hereinafter, referring to FIG. 6, according to an embodiment, an example of an operation of identifying the plurality of sentences by the electronic device based on spacing between the words and moments to which the words are input will be described.

Figure 6:
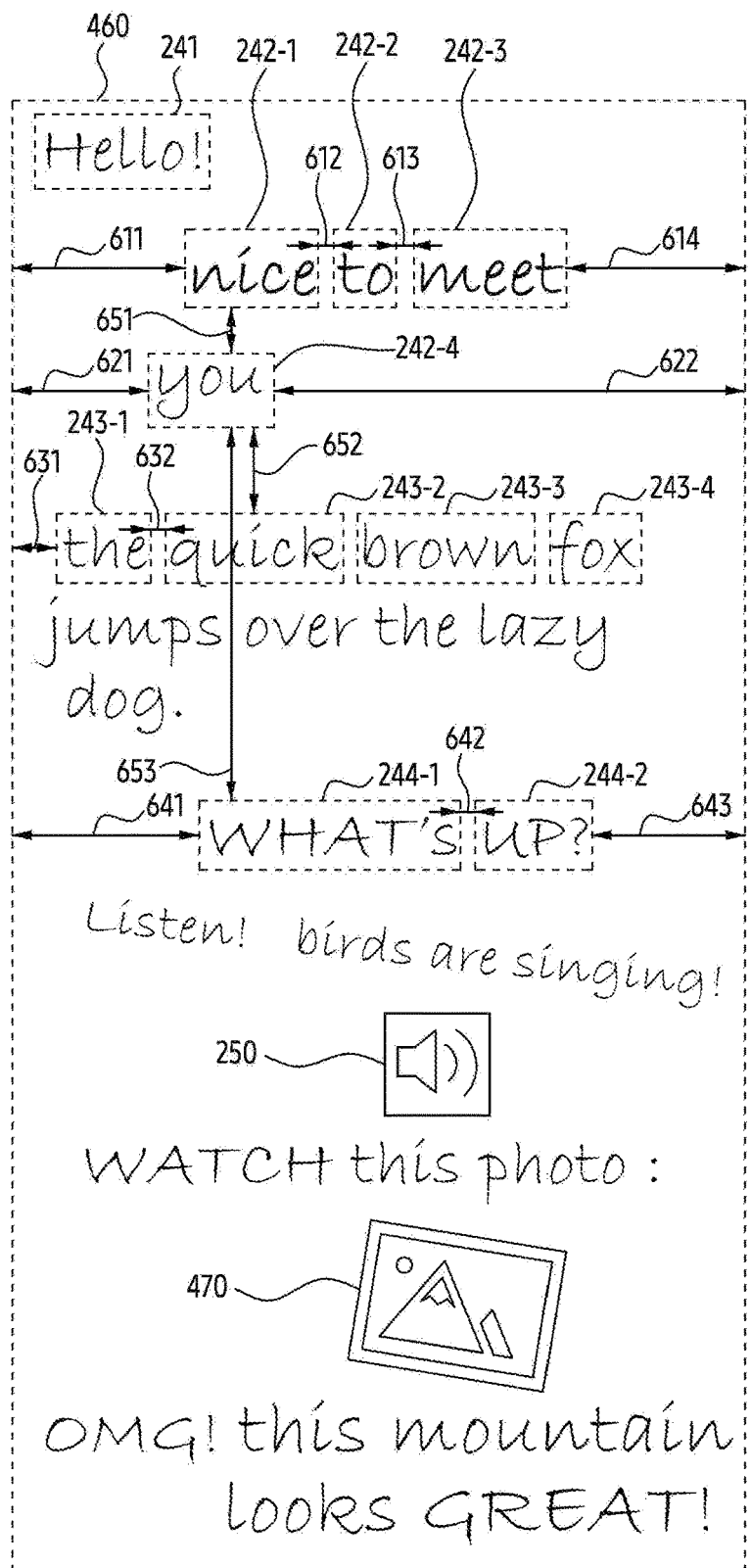
FIG. 6 illustrates an example of an operation in which an electronic device identifies a spacing between words distinguished by a plurality of strokes, according to an embodiment.

FIG. 6 illustrates an example of an operation in which an electronic device identifies a spacing between words distinguished by a plurality of strokes, according to an embodiment. The electronic device of FIG. 6 may be an example of the electronic device of FIGS. 1 to 5. For example, the electronic device 101 of FIG. 3 may include the electronic device of FIG. 6. The media content 460 of FIG. 6 may correspond to the media content 460 of FIGS. 4 to 5.

According to an embodiment, the electronic device may identify a spatial structure (or spatial information) and/or temporal structure (or temporal information) of a plurality of words distinguished by a plurality of strokes included in the media content 460. The spatial structure may indicate spacing between a plurality of words, and/or indentation of at least one of the plurality of words. The temporal structure may indicate moments and/or a sequence in which a plurality of words are inputted. According to an embodiment, identifying the spatial structure and/or the temporal structure by the electronic device may be performed, based on the execution of functions for identifying or selecting a character, word, and/or sentence, such as smart selection. For example, based on the execution of the function, the electronic device may obtain spatial information and/or temporal information for a plurality of words based on the execution of the handwriting recognizer 330 of FIG. 3.

According to an embodiment, the electronic device may group a plurality of words in units of sentence based on spatial information and temporal information for the plurality of words. For example, the electronic device may obtain a candidate sentence including at least one of a plurality of words in the media content 460 and a probability assigned to the candidate sentence. The probability may indicate a probability that the candidate sentence is a single sentence. The candidate sentence may be referred to as a set of one or more words. According to an embodiment, the electronic device may group each of a plurality of words based on the probability assigned to the candidate sentence. For example, the electronic device may determine a candidate sentence having a probability exceeding a threshold probability as a sentence identified by the media content 460. According to an embodiment, the electronic device may identify a candidate sentence using the spatial information and the temporal information. In one or more embodiments, the electronic device 101 may include software for determining the probability that the candidate sentence is a single sentence. The software can include computer-executable instructions that are processed by the processor 120. The software for determining the probability that the candidate sentence is a single sentence can include one or more algorithms based on heuristics, rules-based logic, and/or training the algorithm to form a machine learning model. When training the algorithm to classify the candidate sentence as a single sentence or not or when training the algorithm to output a probability value, the training includes training the algorithm using training data in which the training data includes labels/probability values for the plurality of candidate sentences, each of the candidate sentences having a plurality of words based on spatial information and temporal information for the plurality of words. In one or more embodiments, the software can include and/or call any known software application for determining the probability that the candidate sentence is a single sentence, as understood by one of ordinary skill in art.

Hereinafter, referring to FIG. 6, according to an embodiment, an example of an operation in which the electronic device obtains temporal information of a plurality of words will be described. According to an embodiment, the electronic device may obtain the temporal information including moments in which each of a plurality of words is inputted, and/or indexes assigned to each of the plurality of words based on the moments. According to an embodiment, the electronic device may obtain moments and/or timestamps to which all strokes included in the media content 460 are inputted from the media content 460. The electronic device may obtain moments and/or timestamps to which each of the words, which are a group of strokes, is inputted based on moments and/or timestamps to which strokes are inputted. Within the temporal information, a timestamp assigned to a word may be a representative value (e.g., minimum value, maximum value, average value, and/or intermediate value) of timestamps in which the strokes included in the word are inputted.

Referring to FIG. 6, according to an embodiment, the electronic device may obtain moments and/or sequences to which each of the words is inputted from the temporal information included in the media content 460. The difference between moments to which interconnected words are inputted in the sequence may be relatively increased when words are included in another sentence. For example, the difference between moments in which a word (e.g., "Hello!") included in the sentence 241 and a first word (e.g., word 242-1 indicating "nice") in the sentence 242 recorded immediately after the sentence 241 are recorded may exceed the difference between moments in which words 242-1 and 242-2 in the sentence 242 are recorded. According to an embodiment, the electronic device may classify the words into different sentences, based on temporal information including moments and/or sequences to which the words are inputted. Hereinafter, it is assumed that the temporal information is recorded as a sequence of words 242-1, 242-2, 242-3, and 242-4 included in the sentence 242, words 244-1 and 244-2 included in sentence 244, and words 243-1, 243-2, 243-3 and 243-4 (e.g., in the sentence 243 depicted in FIG. 7 below).

Hereinafter, referring to FIG. 6, according to an embodiment, an example of an operation in which an electronic device obtains spatial information of a plurality of words will be described. According to an embodiment, the electronic device may obtain the spatial information including spacings between a plurality of words, and the position of the word such as indentation, margin, and/or padding in the media content 460. The spatial information may include spacing between a plurality of words measured in a first direction in which a plurality of words are sequentially inputted, and a direction different from the first direction (e.g., a second direction perpendicular to the first direction). Hereinafter, the first direction may be a direction connecting at least two characters included in any one of a plurality of words. For example, the first direction may be parallel to a direction of at least one line formed by the plurality of words.

Referring to FIG. 6, according to an embodiment, spacings 611, 612, 613, and 614 identified by the electronic device from words 242-1, 242-2, and 242-3 in single line formed along the first direction are illustrated. The electronic device may obtain spacings 611, 612, 613, and 614 based on areas occupied by the words 242-1, 242-2, and 242-3 in the media content 460. The areas may be formed in the media content 460 based on the shape of the figure, such as squares of dashed lines surrounding each of the words 242-1, 242-2, and 242-3 of FIG. 6. For example, the electronic device may obtain the areas from words 242-1, 242-2, and 242-3 based on the rectangular data structure.

Referring to FIG. 6, spacing 611 may be a margin of word 242-1 drawn first among the words 242-1, 242-2, and 242-3. The spacing 612 may be a distance between the words 242-1 and 242-2. The spacing 613 may be a distance between the words 242-2 and 242-3. The spacing 614 may be a margin formed in the media content 460 by the word 242-3 drawn at the last among the words 242-1, 242-2, and 242-3. The spacings 611, 612, 613, and 614 may be more than (i.e., greater than) spacings between the characters in each of the words 242-1, 242-2, and 242-3.

Similar to an operation of identifying spacings 611, 612, 613, and 614 based on words 242-1, 242-2, and 242-3, the electronic device may obtain spacings between other words in the media content 460 based on the first direction. For example, spacings 621 and 622 may be a margin of word 242-4. The spacing 631 may be a margin of the word 243-1. The spacing 632 may be spacing between the words 243-1 and 243-2. The spacing 641 may be a margin of the word 244-1. The spacing 642 may be spacing between the words 244-1 and 244-2. The spacing 643 may be a margin in the media content 460 formed by word 244-2.

According to an embodiment, based on spacing between words included in each of a plurality of lines divided along a second direction perpendicular to the first direction, the electronic device may identify spacing between the plurality of lines. The spacing 651, 652, and 653 of FIG. 6 may exemplarily represent spacing between the plurality of lines. For example, the spacing 651 may be a distance in the second direction between words 242-1 and 242-4. The spacing 651 may be a distance between the first line formed by words 242-1, 242-2, and 242-3 and the second line formed by the word 242-4. The spacing 652 may be a distance between the second line formed by the word 242-4 and a third line formed by words 243-1, 243-2, 243-3, and 243-4.

Referring to FIG. 6, the spacing 653 may be a distance between the second line formed by the word 242-4 and a fourth line formed by words 244-1 and 244-2. Based on using the temporal information, the electronic device may obtain the spacing 653 between the second line including the word 242-4 and the fourth line including the word 244-1, based on identifying that the word 244-1 was recorded immediately after the word 242-4 within the second line was recorded using the temporal information. The word 244-1 recorded immediately after the word 242-4 in the second line is recorded may be identified based on a direct connection of words 242-4 and words 244-1 within the sequence indicated by the temporal information. According to an embodiment, the electronic device may obtain spacing based on the sequence of words indicated by the temporal information. For example, the electronic device may obtain the spacing 653 between words 242-4 and 244-1 directly connected within the sequence.

According to an embodiment, the electronic device may obtain spacings between a plurality of words and/or a plurality of lines, independently of a unit (e.g., a page) for dividing the media content 460 to display or print the media content 460. For example, in a state that words 242-4 and words 244-1 are displayed on different pages, the electronic device may obtain a spacing 653 between the words 242-4 and the words 244-1, independently of the distance between the pages and/or arrangement. In an embodiment, the electronic device may exclude the width and/or height of multimedia content (e.g., the image 470 and/or audio corresponding to the icon 250) included in the media content 460 from spacing between words (e.g., when determining the spacing between words).

According to an embodiment, the spatial information obtained by the electronic device from words in the media content 460 may include data on the words formed along the first direction and/or the second direction and/or spacings between the lines, such as the spacings 611, 612, 613, 614, 621, 622, 631, 632, 641, 642, 643, 651, 652, and 653. The spatial information may include one or more weights based on the spacings. For example, the electronic device may assign weights to each of the spacings based on whether each of the spacings exceeds a designated threshold. Each of the weights included in the spatial information may indicate a probability that the spacing corresponding to the weight is a spacing formed between sentences. According to an embodiment, the electronic device may identify at least one candidate sentence based on the data and/or the weights included in the spatial information.

According to an embodiment, the electronic device may identify at least one sentence using the temporal information and the spatial information. For example, when the spacing 622 formed by the word 242-4 exceeds the designated spacing or the difference between a moment when the word 242-4 is inputted and a moment when the word 244-1 recorded immediately after the word 242-4 is inputted exceeds the designated time difference, the electronic device may determine that the words 242-4 and 244-1 are included in different sentences 242 and 244. For example, the electronic device may identify the word 242-4 as the last word of the sentence 242. For example, when the spacing 651 between the first line and the second line is less than the spaces 652 and 653 formed by the second line and other lines, or when the spacing 651 is less than or equal to the designated spacing, the electronic device may determine that the first line and the second line adjacent to the spacing 651 are a single sentence 242.

As described above, according to an embodiment, the electronic device may identify whether the words are included in different sentences based on at least one of spacing between words, moments in which words are inputted, or difference between the moments. Spacing between words may include spacing between words directly connected within the sequence in which the words are inputted.

According to an embodiment, the electronic device may identify at least one sentence from the media content 460 using a model trained to identify a plurality of strokes in units of sentence. Hereinafter, referring to FIG. 7, according to an embodiment, an operation in which the electronic device identifies the at least one sentence using the model will be described.

Figure 7:
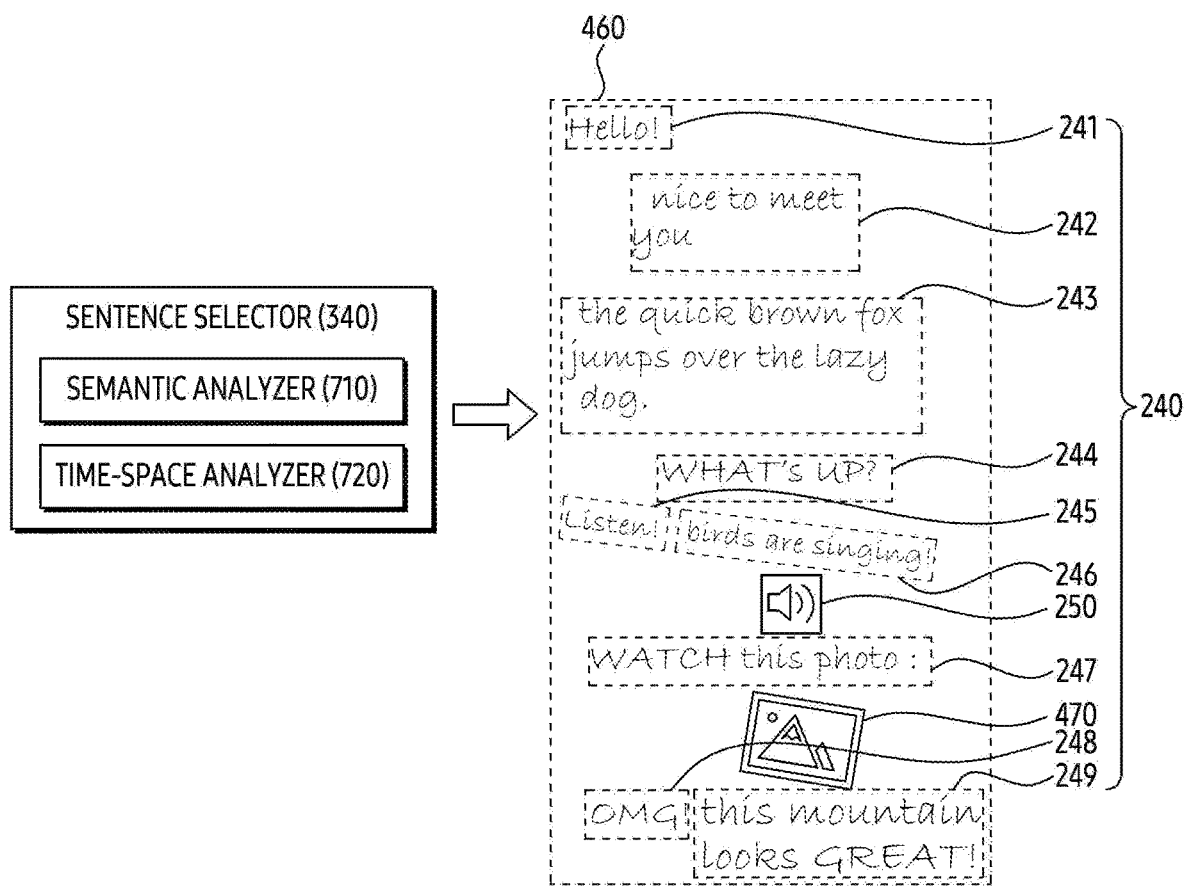
FIG. 7 illustrates an example of an operation in which an electronic device identifies a sentence from a plurality of strokes, according to an embodiment.

FIG. 7 illustrates an example of an operation in which an electronic device identifies a sentence 240 from a plurality of strokes, according to an embodiment. The electronic device of FIG. 7 may be an example of the electronic device of FIGS. 1 to 6. For example, the electronic device 101 of FIG. 3 may include the electronic device of FIG. 7. For example, the sentence selector 340 of FIG. 3 may include the sentence selector 340 of FIG. 7. The media content 460 of FIG. 7 may correspond to the media content 460 of FIGS. 4 to 6.

Referring to FIG. 7, according to an embodiment, the electronic device may identify the sentence 240 from the strokes included in the media content 460 based on the sentence selector 340. In an embodiment, the sentence selector 340 may include a model that mimics the computational power of the biological nervous system using a plurality of artificial neurons (or nodes). The model may be operated based on software based on instructions stored in a memory (e.g., the memory 130 in FIG. 3), such as the sentence selector 340, and/or hardware such as a neural processing unit (NPU). Referring to FIG. 7, a semantic analyzer 710 and a time-space analyzer 720 are illustrated as models included in the sentence selector 340. The embodiment is not limited thereto, and for example, the electronic device may be operated based on deterministic algorithms for obtaining the temporal information and the spatial information described above with reference to FIG. 6, based on the execution of the time-space analyzer 720.

According to an embodiment, the electronic device may obtain the sentence 240 from a plurality of strokes in the media content 460, based on the semantic analyzer 710 including a model trained to extract text from single sentences of a plurality of strokes. The model may be a neural network based on long short-term memory (LSTM) and/or recurrent neural network (RNN). For example, the semantic analyzer 710 may include a model trained based on input data including one or more strokes divided in units of sentences, a text label identified from one or more strokes, and/or ground truth information. The electronic device may output information representing one or more sentences from a plurality of strokes using the model of the semantic analyzer 710.

According to an embodiment, the electronic device may obtain temporal information and/or spatial information of words divided by a plurality of strokes based on the time-space analyzer 720. Using the time-space analyzer 720, the electronic device may obtain spatial information indicating spacing between the words and temporal information indicating moments and/or sequences to which the words are inputted, from the words in the media content 460. In an embodiment, the time-space analyzer 720 may include a model trained to obtain the temporal information and/or the spatial information.

According to an embodiment, the electronic device may identify the sentence 240 in the media content 460 based on the information obtained from the semantic analyzer 710, and the temporal information and the spatial information obtained from the time-space analyzer 720. For example, the electronic device may identify the sentence 240 based on a model (or attention layer) receiving information obtained from the semantic analyzer 710, and the temporal information and the spatial information obtained from the time-space analyzer 720. Referring to FIG. 7, sentences 241, 242, 243, 244, 245, 246, 247, 248, and 249 obtained by the electronic device using the sentence selector 340 including the semantic analyzer 710 and the time-space analyzer 720 are illustrated. According to an embodiment, the electronic device may respond to an input for selecting a specific sentence within handwriting represented by a plurality of strokes using the identified sentences 241, 242, 243, 244, 245, 246, 247, 248, and 249.

As described above, according to an embodiment, the electronic device may identify one or more sentences by a group of words, based on the temporal information and/or the spatial information on the words distinguished by the strokes included in the media content 460. The electronic device may enhance the accuracy of identifying a sentence using a model trained by handwriting divided into units of sentence (e.g., a model of the semantic analyzer 710) together with the temporal information and the spatial information. According to an embodiment, in response to an input indicating that the strokes are selected as a unit of sentence in the media content 460, the electronic device may obtain at least one sentence including the strokes selected by the input. The electronic device may highlight the at least one sentence, or output a text indicating the at least one sentence.

Hereinafter, referring to FIGS. 8A to 8C, 9A to 9B, and/or FIG. 10, according to an embodiment, an example of an operation in response to an input indicating that the electronic device selects strokes as a unit of sentence will be described.

Figure 8A:
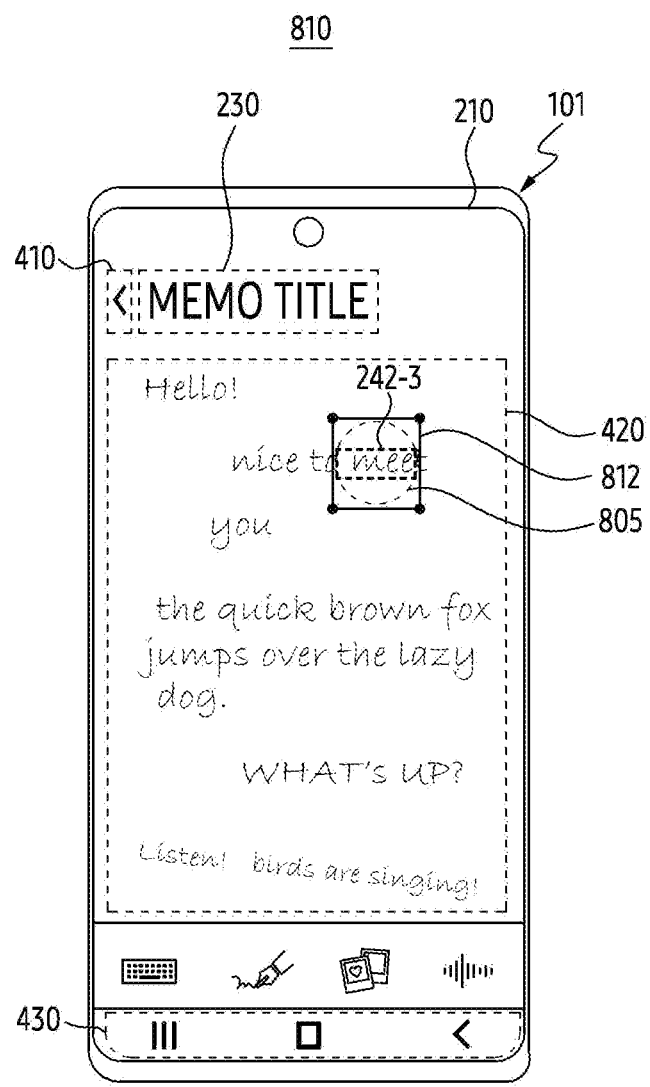
FIGS. 8A to 8C illustrate an example of an operation in which an electronic device identifies a word, a character, and/or a sentence based on a user's gesture, according to an embodiment.
Figure 8B:
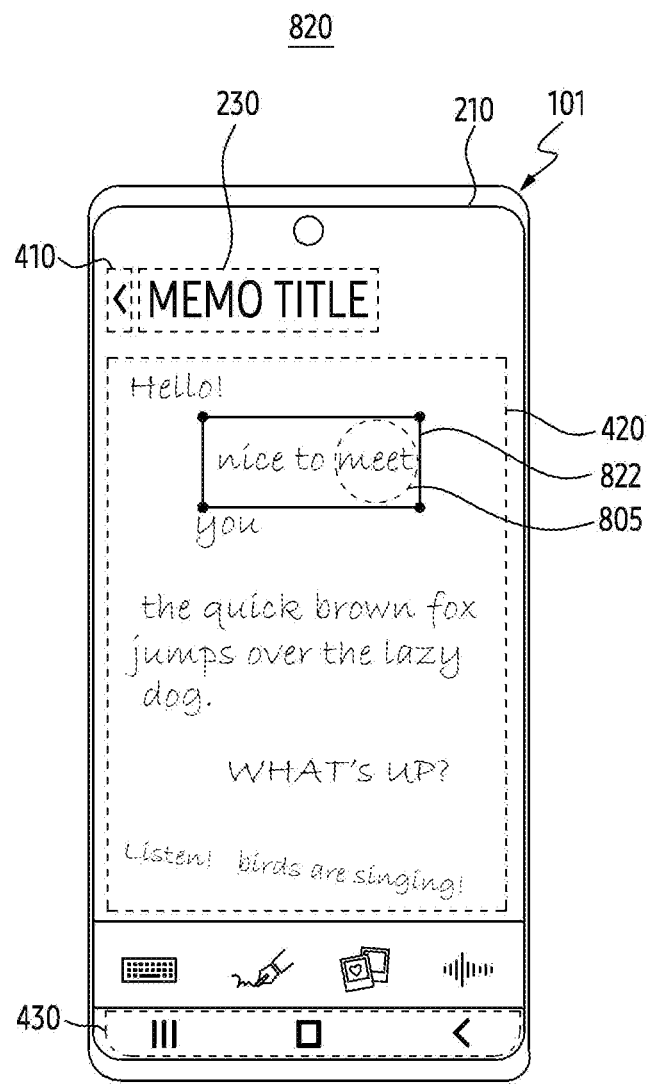
Figure 8C:
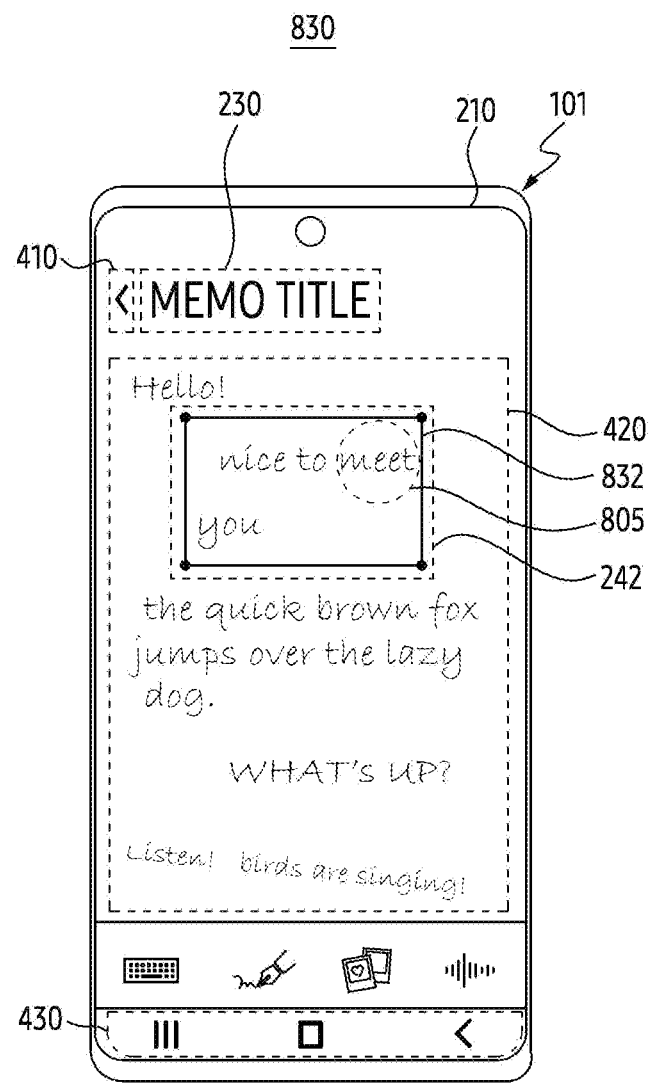

FIGS. 8A to 8C illustrate an example of an operation in which an electronic device identifies a word, a character, and/or a sentence based on a user's gesture, according to an embodiment. The electronic device 101 of FIGS. 8A to 8C may be an example of the electronic device of FIGS. 1 to 7. For example, the electronic device 101 and the display 210 of FIG. 3 may include the electronic device 101 and the display 210 of FIGS. 8A to 8C. For example, the states 810, 820, and 830, respectively, of FIGS. 8A to 8C may be different states in which the electronic device 101 displays a screen based on the execution of the note application 320 of FIG. 3. For example, the areas 410, 420, and 430 of FIG. 4 may include areas 410, 420, and 430, respectively, of FIGS. 8A to 8C.

Referring to FIG. 8A, within a state 810 in which at least a part of media content (e.g., the media content 460 of FIGS. 4 to 7) is displayed in the area 420, the electronic device 101 may receive an input indicating that a word (e.g., "meet") displayed in the point 805 within the area 420 is selected. The input may include a double-tap gesture of tapping the point 805 twice within a designated period. Although the operation of the electronic device 101 with respect to an input based on the point 805 is exemplarily described, the embodiment is not limited thereto. For example, based on a double-tap gesture performed on another word in media content displayed through the area 420, the electronic device 101 may receive another input indicating that the other word is selected.

According to an embodiment, the electronic device 101 may identify at least one word 242-3 including strokes displayed in the point 805 in response to an input indicating that the word displayed in the point 805 is selected. For example, the electronic device 101 may identify a word 242-3 including strokes represented in the point 805 specified by the input, based on the execution of the handwriting recognizer 330 of FIG. 3.

Referring to FIG. 8A, based on identifying the word 242-3 based on the input, the electronic device 101 may display a visual object 812 for highlighting the word 242-3 in the area 420. For example, the electronic device 101 may display the visual object 812 having a rectangle shape surrounding the word 242-3. The shape of the visual object 812 is not limited to the rectangle shape of FIG. 8A. According to an embodiment, the electronic device 101 may display the word 242-3 or may invert the color of word 242-3, based on a color (e.g., blue, red) different from other words included in the media content.

According to an embodiment, in a state 810 in which the word 242-3 is identified or selected based on the visual object 812, the electronic device 101 may receive an input indicating adjustment of a character and/or word selected in media content based on the visual object 812. For example, based on an input indicating an extension or reduction of the visual object 812, the electronic device 101 may identify at least one character included in the visual object 812 expanded or reduced by the input.

According to an embodiment, the electronic device 101 may identify a single line distinguished by strokes in the media content based on another input different from the input indicating that word is selected in the media content. Referring to FIG. 8B, according to an embodiment, the state 820 in which a single line including a word displayed in the point 805 is identified in response to the electronic device 101 receiving the other input based on the point 805 in the area 420 is exemplarily illustrated. For example, the other input may include a triple-tap gesture of tapping the point 805 three times within a designated period.

According to an embodiment, in response to an input indicating that a single line is selected, such as a triple-tap gesture performed on the point 805, the electronic device 101 may identify a single line including strokes displayed within the point 805 selected by the input within the media content. The electronic device 101 may display the visual object 822 indicating that the identified line is selected. Referring to FIG. 8B, based on the visual object 822 having a rectangular shape, the electronic device 101 may highlight a line (e.g., "nice to meet") including strokes represented in the point 805 more than other lines. The shape of the visual object 822 is not limited to the shape of the rectangle of FIG. 8B. The electronic device 101 may display strokes in the line identified based on the input, based on a color different from other strokes in the media content.

According to an embodiment, the electronic device 101 may receive an input indicating that indicates that a single sentence is selected, which is different from the inputs described above with reference to FIGS. 8A to 8B. Referring to FIG. 8C, the electronic device 101 may receive an input indicating that a single sentence including strokes included in the point 805 is selected. The input may include a quad-tap gesture of tapping the point 805 four times during a designated period. In response to the input, the electronic device 101 may identify the sentence 242 including the strokes represented in the point 805 based on the execution of the handwriting recognizer 330 and/or the sentence selector 340 of FIG. 3.

Referring to FIG. 8C, in response to an input indicating that a sentence is selected based on the point 805, a state 830 in which the electronic device 101 identifies the sentence 242 including strokes represented within the point 805 is exemplarily illustrated. The electronic device 101 may display the visual object 832 for highlighting the sentence 242. The visual object 832 may indicate that the sentence 242 is identified or selected based on the shape of the rectangle, similar to the visual objects 812 and 822 of FIGS. 8A to 8B. However, the shape of the visual object 832 is not limited thereto. According to an embodiment, the electronic device 101 may display strokes (e.g., strokes representing "nice to meet you") included in the sentence 242 in a color different from other strokes displayed in the area 420 to indicate that the sentence 242 is identified or selected.

According to an embodiment, the electronic device 101 may receive an input indicating movement and/or rotation of a word, a line, and a sentence designated by visual objects 812, 822, and 832, based on the visual objects 812, 822, and 832, respectively, of FIGS. 8A to 8C. For example, the electronic device 101 may move the strokes included in the visual object 832 within the media content, based on a gesture of dragging the visual object 832. For example, the electronic device 101 may rotate the strokes included in the visual object 832 in media content based on a gesture rotating the visual object 832. According to an embodiment, the electronic device 101 may additionally display visual objects for executing a function based on a text corresponding to a word, line, and sentence specified by the visual objects 812, 822, and 832.

According to an embodiment, the electronic device 101 may execute a function of identifying or selecting strokes in units of sentence as well as word and line. Hereinafter, referring to FIGS. 9A to 9B, according to an embodiment, an example of an operation in which the electronic device identifies a sentence and provides a UI for executing a function related to a text corresponding to the identified sentence is described.

Figure 9A:
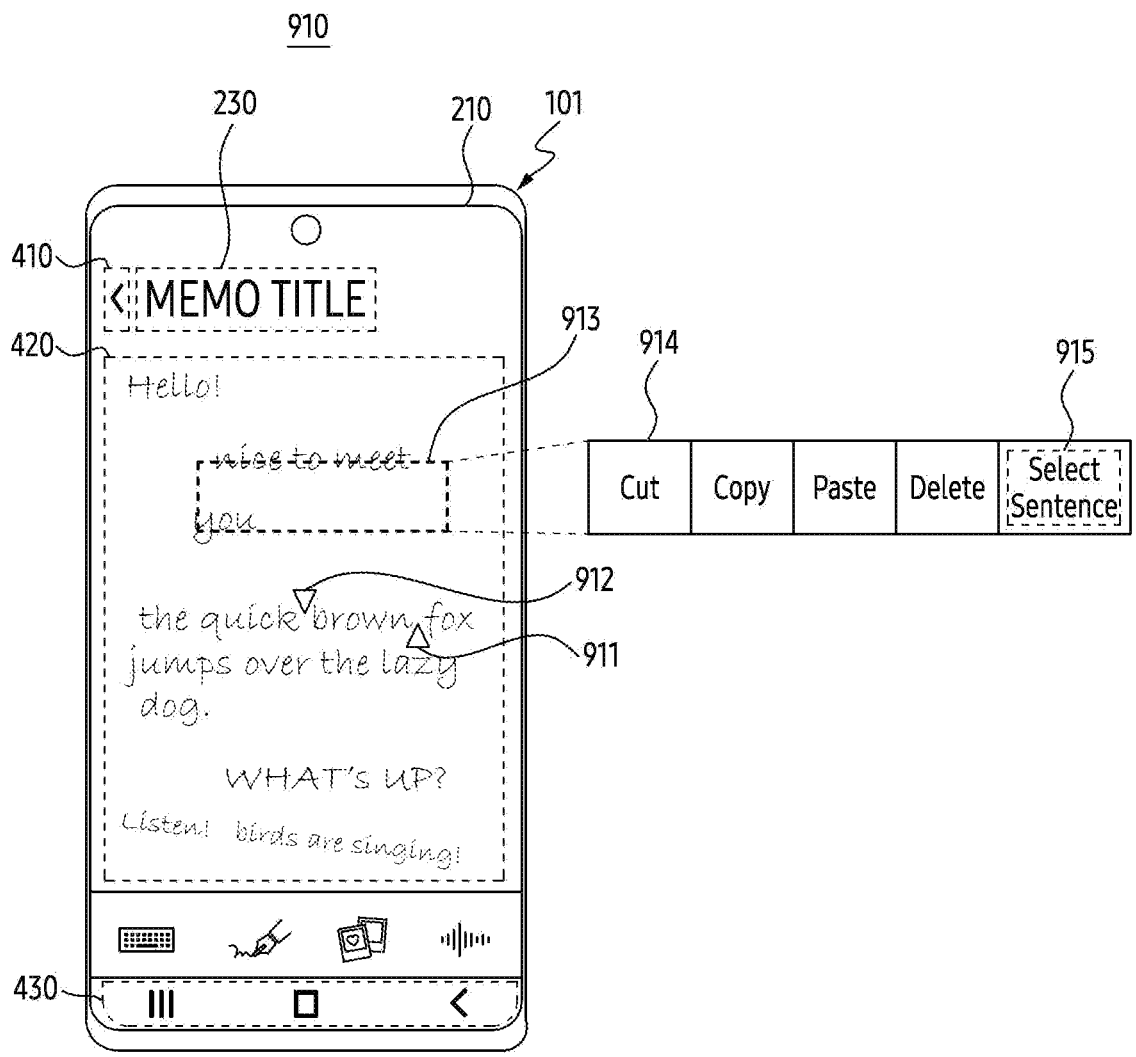
FIGS. 9A to 9B illustrate an example of an operation in which an electronic device identifies a sentence from media content including a plurality of strokes, according to an embodiment.
Figure 9B:
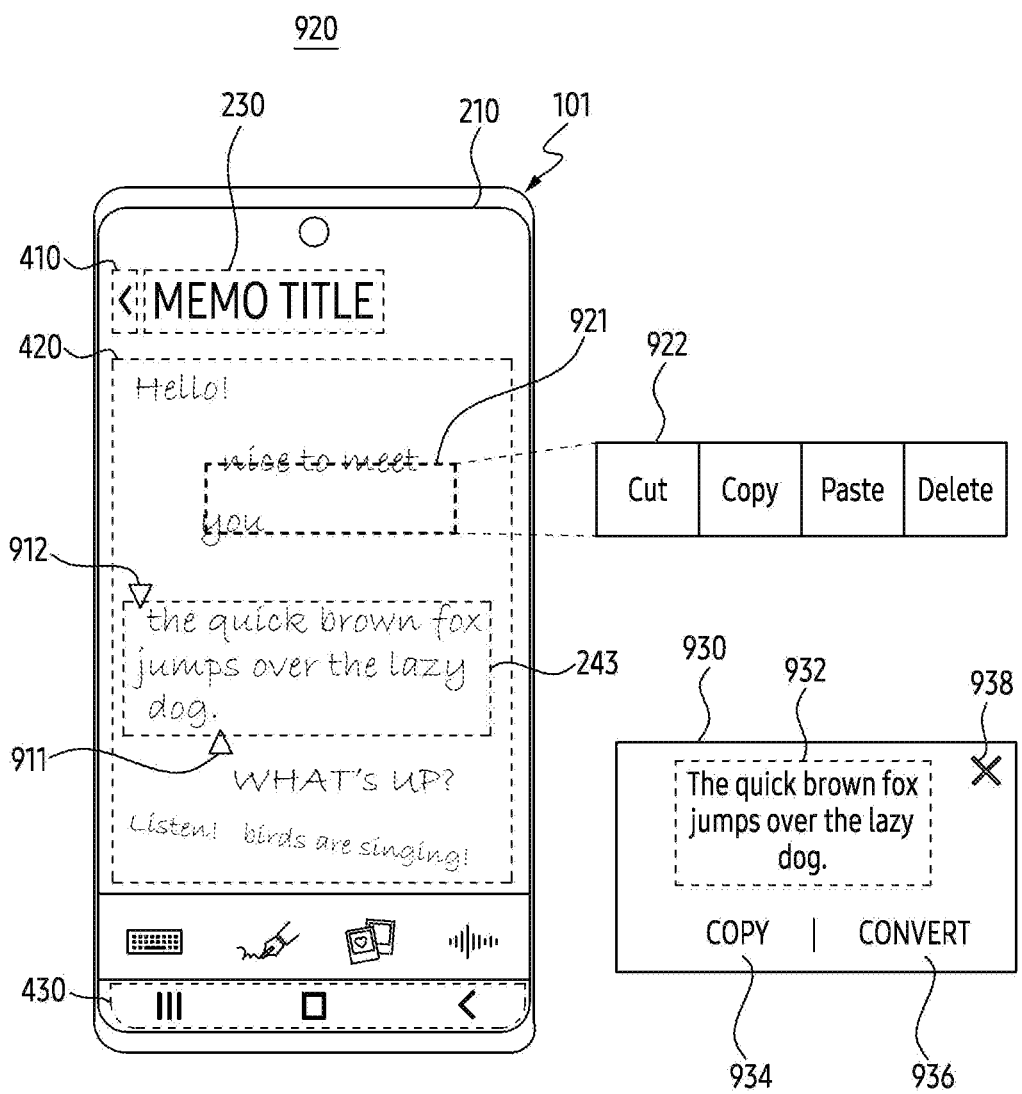

According to an embodiment, FIGS. 9A to 9B illustrate an example of an operation in which the electronic device 101 identifies a sentence from media content including a plurality of strokes. The electronic device 101 of FIGS. 9A to 9B may be an example of the electronic device of FIGS. 1 to 7 and/or the electronic device 101 of FIGS. 8A to 8C. For example, the electronic device 101 and the display 210 of FIG. 3 may include the electronic device 101 and the display 210 of FIGS. 9A to 9B. For example, the states 910 and 920 of FIGS. 9A to 9B, respectively, may be different states in which the electronic device 101 displays a screen based on the execution of the note application 320 of FIG. 3. For example, the areas 410, 420, and 430 of FIG. 4 may include the areas 410, 420, and 430 of FIGS. 9A to 9B.

Referring to FIG. 9A, in a state 910 in which at least a part of media content is displayed in the area 420 of the display 210, the electronic device 101 may display handles 911 and 912 for identifying strokes in the media content in units of a character and/or a word. For example, the electronic device 101 may display at least one character distinguished by the strokes based on information indicating sequentially drawn strokes by the user in media content. The display of handles 911 and 912 by the electronic device 101 may be performed in response to an input indicating that the handles 911 and 912 are to be displayed, such as a long-touch gesture performed in the area 420. Each of the handles 911 and 912 may represent the start and end of at least one character and/or word selected by the user, among the characters and/or words distinguished by the strokes, respectively. Based on an input indicating dragging any one of the handles 911 and 912, the electronic device 101 may change at least one character and/or word selected by the user based on a position of the handle dragged by the input among the handles 911 and 912.

Referring to FIG. 9A, in a state 910 in which strokes representing a specific word (e.g., strokes representing "brown") are identified based on the handles 911 and 912, the electronic device 101 may display a menu 914 for executing a function related to a text displayed by strokes between the handles 911 and 912. According to an embodiment, the electronic device 101 may display the menu 914 in an area 913 of the display 210 in a state 910 in which the handles 911 and 912 are displayed. The electronic device 101 may display a list of functions related to at least one character ("brown" in the state 910 of FIG. 9A) identified by the handles 911 and 912 by using the menu 914.

Referring to FIG. 9A, functions provided through the menu 914 may include a function (e.g., a function corresponding to an option including a designated text such as "copy") for copying at least one character identified based on the handles 911 and 912. Copying at least one character may include at least temporarily storing text represented by strokes between the handles 911 and 912 within a designated area (e.g., clipboard) of a memory (e.g., the memory 130 of FIG. 3). Functions provided through the menu 914 may include a function (e.g., a function corresponding to an option including a designated text such as "cut") for cutting out at least one character identified based on the handles 911 and 912. Cutting out at least one character may include at least temporarily stopping the display of strokes between the handles 911 and 912. Functions provided through the menu 914 may include a function (e.g., a function corresponding to an option including designated text such as "paste") for inserting text stored within a designated area (e.g., clipboard) of a memory in a part of media content identified by the handles 911 and 912. Functions provided through the menu 914 may include a function for removing strokes between the handles 911 and 912 from media content (e.g., a function corresponding to an option including designated text such as "delete").

Referring to FIG. 9A, in a state 910 in which strokes between the handles 911 and 912 do not match a single sentence, the electronic device 101 may display a visual object 915 for identifying at least one sentence including strokes between the handles 911 and 912, in the menu 914. In the menu 914, other visual objects except the visual object 915 may correspond to functions related to at least one character selected by the handles 911 and 912. The visual object 915 may include designated text for guiding identification of a sentence, such as "select sentence". In response to an input indicating that the visual object 915 is selected in state 910 of FIG. 9A, the electronic device 101 may identify a sentence including strokes between the handles 911 and 912 in media content, based on the handwriting recognizer 330 and/or the sentence selector 340 of FIG. 3. According to an embodiment, as described above with reference to FIGS. 5 to 7, identification of a sentence by the electronic device 101 may be performed based on a spacing between words distinguished by strokes included in the media content and/or moments at which the words are inputted.

Referring to FIG. 9B, according to an embodiment, an example of a state 920 in which the electronic device 101 identifies at least one sentence 243 in the media content in response to an input indicating that the visual object 915 of FIG. 9A is selected is illustrated. For example, in response to the input, the electronic device 101 may identify a sentence 243 (e.g., "the quick brown fox jumps over the lazy dog") including the strokes between the handles 911 and 912 of FIG. 9A. In FIG. 9B, the electronic device 101 may display the handles 911 and 912 at a point where the sentence 243 starts and at a point where the sentence 243 ends, respectively, in the media content. The electronic device 101 may display the sentence 243 in a color different from other sentences in the media content.

Referring to FIG. 9B, according to an embodiment, the electronic device 101 may display the menu 922 in association with at least one sentence included in the sentence 243 in a state in which the sentence 243 is identified. For example, the menu 922 may be overlapped on a portion 921 adjacent to the sentence 243 within the area 420 of the display 210. According to an embodiment, in a state 920 in which a single sentence is identified, such as the sentence 243, the electronic device 101 may at least temporarily cease displaying a visual object (e.g., the visual object 915 of FIG. 9A) for identifying a single sentence in the menu 922. Suspension of the display of the visual object may be maintained while a single sentence is identified by the handles 911 and 912, as depicted in FIG. 9B. Referring to the menu 914 of FIG. 9A and the menu 922 of FIG. 9B, the display of other visual objects other than the visual object mapped to the function for guiding identification of a single sentence may be maintained.

An operation of the electronic device 101 providing a list of functions related to the strokes identified by the handles 911 and 912 is not limited to the menus 914 and 922 of FIGS. 9A to 9B, respectively. Referring to FIG. 9B, according to an embodiment, in a state 920 in which the sentence 243 is identified, the electronic device 101 may display a pop-up window 930 including a text 932 corresponding to the sentence 243. The electronic device 101 may display the pop-up window 930 by overlapping on the screen within the display 210 of FIG. 9B. In the pop-up window 930, the electronic device 101 may display the text 932 represented by strokes included in the sentence 243. The electronic device 101 may display an icon 938 for ceasing display of the pop-up window 930, in the pop-up window 930. The electronic device 101 may display a button 934 for storing at least temporarily the text 932 in a memory within the pop-up window 930. Referring to FIG. 9B, the button 934 may include designated text such as "copy". In response to an input indicating that the button 934 is selected, the electronic device 101 may cease displaying the pop-up window 930. In response to an input indicating that the button 934 is selected, the electronic device 101 may store the text 932 at least temporarily within a designated area (e.g., clipboard) of the memory.

Referring to FIG. 9B, the electronic device 101 may display a button 936 for converting strokes in media content identified by the handles 911 and 912 into text 932, in the pop-up window 930. The button 936 may include designated text such as "convert". In response to an input indicating that button 936 is selected, the electronic device 101 may remove strokes identified by the handles 911 and 912 from media content and insert the text 932 into at least a part of media content corresponding to the handles 911 and 912.

As described above, according to an embodiment, in a state 910 in which at least one character and/or at least one word distinguished by strokes between handles 911 and 912 is identified, the electronic device 101 may expand the range of strokes selected by the user based on a unit of sentence. For example, the electronic device 101 may display an option to enlarge the range based on the unit of the sentence, such as the visual object 915. The electronic device 101 may recommend the user to select a sentence including the identified word based on an input for selecting a word in the middle of the sentence based on the option. Based on identifying a single sentence, the electronic device 101 may output text corresponding to the sentence identified according to a format readable by the electronic device 101 and/or the processor (e.g., the processor 120 in FIG. 3) such as Unicode.

According to an embodiment, the electronic device 101 may additionally identify multimedia content related to the sentence within the media content in response to an input indicating that the sentence is selected. Hereinafter, according to an embodiment, an example of an operation in which the electronic device 101 identifies the multimedia content based on the input will be described with reference to FIG. 10.

Figure 10:
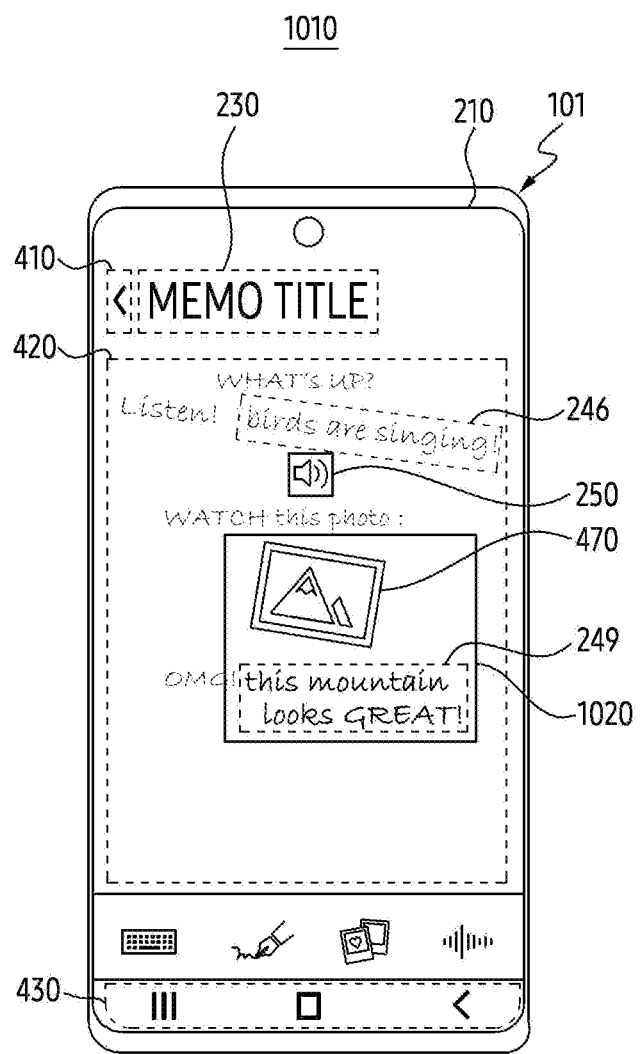
FIG. 10 illustrates an example of an operation in which an electronic device identifies a sentence and an image related to the sentence in the media content from a media content including a plurality of strokes, according to an embodiment.

FIG. 10 illustrates an example of an operation in which an electronic device identifies a sentence and an image related to the sentence in the media content from a media content including a plurality of strokes, according to an embodiment. The electronic device 101 of FIG. 10 may be an example of the electronic device 101 of FIGS. 1 to 7, 8A to 8C, and 9A to 9B. For example, the electronic device 101 and the display 210 of FIG. 3 may include the electronic device 101 and the display 210 of FIG. 10. For example, the state 1010 of FIG. 10 may include a state in which the electronic device 101 displays a screen based on the execution of the note application 320 of FIG. 3. For example, the areas 410, 420, and 430 of FIG. 4 may include the areas 410, 420, and 430 of FIG. 10.

Referring to FIG. 10, in the state 1010, according to an embodiment, the electronic device 101 may display the image 470 included in the media content together with the strokes included in the media content. The electronic device 101 may display an icon 250 for reproducing audio included in the media content together with the strokes included in the media content. The image 470 and the audio may be referred to as multimedia content included in the media content. According to an embodiment, the electronic device 101 may search for multimedia content related to the sentence selected by the input, in response to an input indicating that the sentence distinguished by the strokes is selected. Based on identifying multimedia content related to the sentence, the electronic device 101 may display a visual object indicating that all of the sentence and the multimedia content are identified.

Referring to FIG. 10, in the state 1010, the electronic device 101 may receive an input indicating that the sentence 249 is selected. Based on the input, the electronic device 101 may search for multimedia content related to the sentence 249 within the media content. For example, the electronic device 101 may identify whether words included in the sentence 249 are related to audio corresponding to the image 470 and/or the icon 250. When the subject is identified from the image 470, the electronic device 101 may determine whether the image 470 is related to the sentence 249 based on whether the word representing the subject is included in the sentence 249. When text based on speech-to-text (STT) is identified from the audio, the electronic device 101 may determine whether audio is related to the sentence 249 based on whether at least one of the words in the sentence 249 is included in the text.

Referring to FIG. 10, based on identifying that the word (e.g., "mountain") included in the sentence 249 represents the subject (e.g., mountain) included in the image 470, the electronic device 101 may identify all of the sentence 249 and the image 470. For example, the electronic device 101 may display a visual object 1020 including all of the sentence 249 and the image 470. Although an example in which the visual object 1020 has a rectangular shape surrounding all of the sentence 249 and the image 470 is illustrated, the embodiment is not limited thereto. In an embodiment, the electronic device 101 may display the sentence 249 and the image 470 in a designated color for indicating a selection by the user.

Although the operation of the electronic device 101 is described based on the image 470, the embodiment is not limited thereto. Referring to FIG. 10, when the audio corresponding to the icon 250 includes a sound (e.g., a bird's cry) related to a word (e.g., "birds") included in a sentence 246, the electronic device 101 may display a visual object indicating that all of the icon 250 and the sentence 246 are identified, in response to an input indicating that the sentence 246 is selected.

As described above, according to an embodiment, in a state 1010 of displaying media content including strokes representing handwriting, the electronic device 101 may identify the sentence based on the temporal information and the spatial information on the words distinguished by the strokes, in response to an input indicating that a sentence (e.g., sentences 246 and 249) distinguished by the strokes is selected. The electronic device 101 may identify multimedia content related to the identified sentence among multimedia content included in the media content. In response to identifying the multimedia content, the electronic device 101 may display a visual object 1020 indicating that all of the sentence and the multimedia content are identified.

Hereinafter, an operation of the electronic device 101 according to an embodiment will be described with reference to FIGS. 11 to 13.

Figure 11:
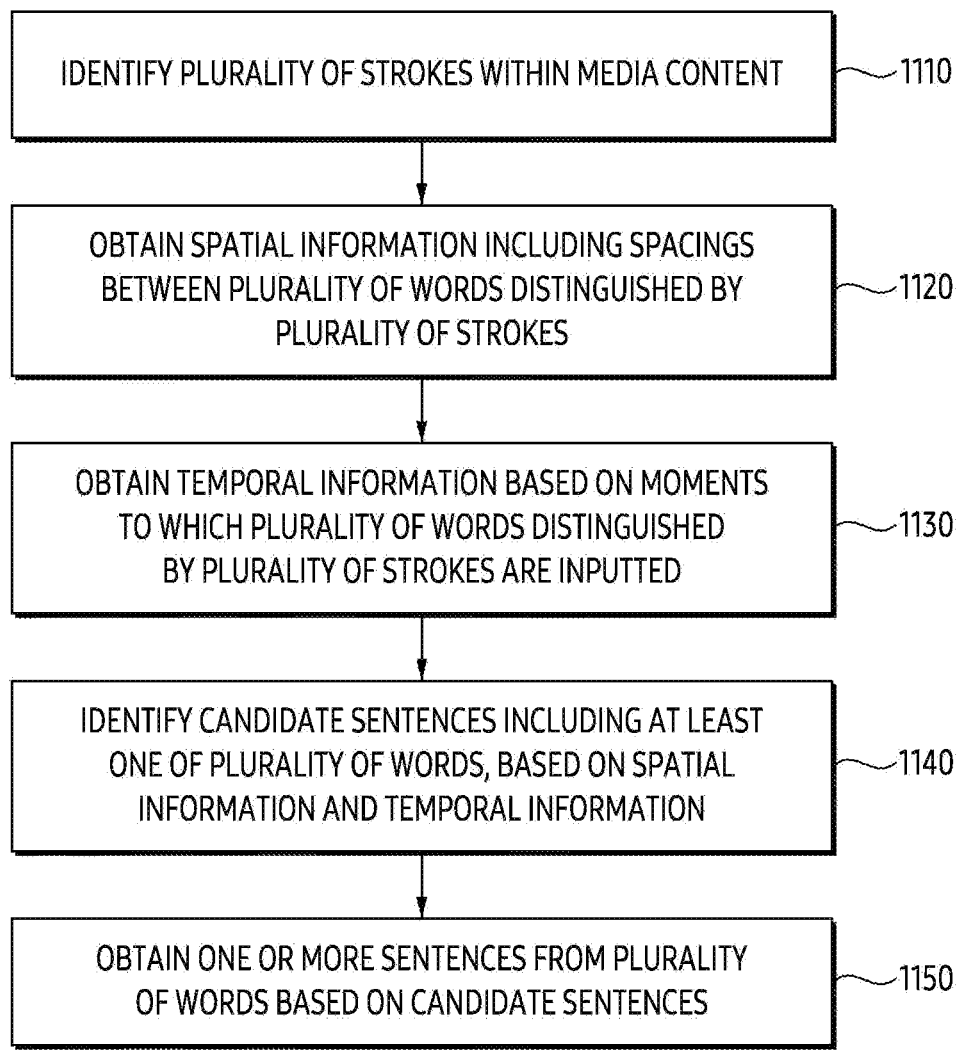
FIG. 11 illustrates an example of a flowchart for describing an operation of obtaining one or more sentences from a plurality of strokes by an electronic device, according to an embodiment.

FIG. 11 illustrates an example of a flowchart for describing an operation of obtaining one or more sentences from a plurality of strokes by an electronic device, according to an embodiment. The electronic device of FIG. 11 may be an example of the electronic device 101 of FIGS. 1 to 10. For example, at least one of the operations of FIG. 11 may be performed by the electronic device 101 and/or the processor 120 of FIG. 3.

Referring to FIG. 11, in operation 1110, according to an embodiment, the electronic device may identify a plurality of strokes within the media content. The media content may include the media content 460 of FIGS. 4 to 7. The plurality of strokes may represent trajectories sequentially drawn by a user, as shown in the strokes 512 and 514 of FIG. 5. For example, the plurality of strokes may represent handwriting input by the user. Identifying the plurality of strokes by the electronic device may include identifying one or more words distinguished by the plurality of strokes.

Referring to FIG. 11, in operation 1120, according to an embodiment, the electronic device may obtain spatial information including spacings between a plurality of words distinguished by a plurality of strokes. The spacing identified by the electronic device may include spacing between words, margin of word, and/or indentation. According to an embodiment, the electronic device may identify the spaces based on the first direction connecting the characters within the word and a second direction perpendicular to the first direction. For example, the spacings in operation 1120 may include the spaces 611, 612, 613, 614, 621, 622, 631, 632, 641, 642, 643, 651, 652, and 653.

Referring to FIG. 11, in operation 1130, according to an embodiment, the electronic device may obtain temporal information based on moments to which a plurality of words distinguished by a plurality of strokes are inputted. The temporal information may represent the moments based on a timestamp. The temporal information may include a sequence to which the plurality of words are inputted.

Referring to FIG. 11, in operation 1140, according to an embodiment, the electronic device may identify candidate sentences including at least one of a plurality of words, based on the spatial information and the temporal information. For example, the electronic device may identify the candidate sentences based on the sentence selector 340 of FIG. 3, the semantic analyzer 710 of FIG. 7, and/or the time-space analyzer 720. The electronic device may identify the candidate sentences based on sets including at least one word. The electronic device may obtain a probability that each of the candidate sentences is a sentence distinguished by the plurality of words.

Referring to FIG. 11, in operation 1150, according to an embodiment, the electronic device may obtain one or more sentences from a plurality of words based on candidate sentences. For example, the electronic device may obtain the one or more sentences based on probabilities assigned to the candidate sentences. According to an embodiment, in a state in which one or more sentences are obtained, the electronic device may perform a function of identifying at least one sentence including a character and/or a word selected by the user based on operation 1150.

Figure 12A:
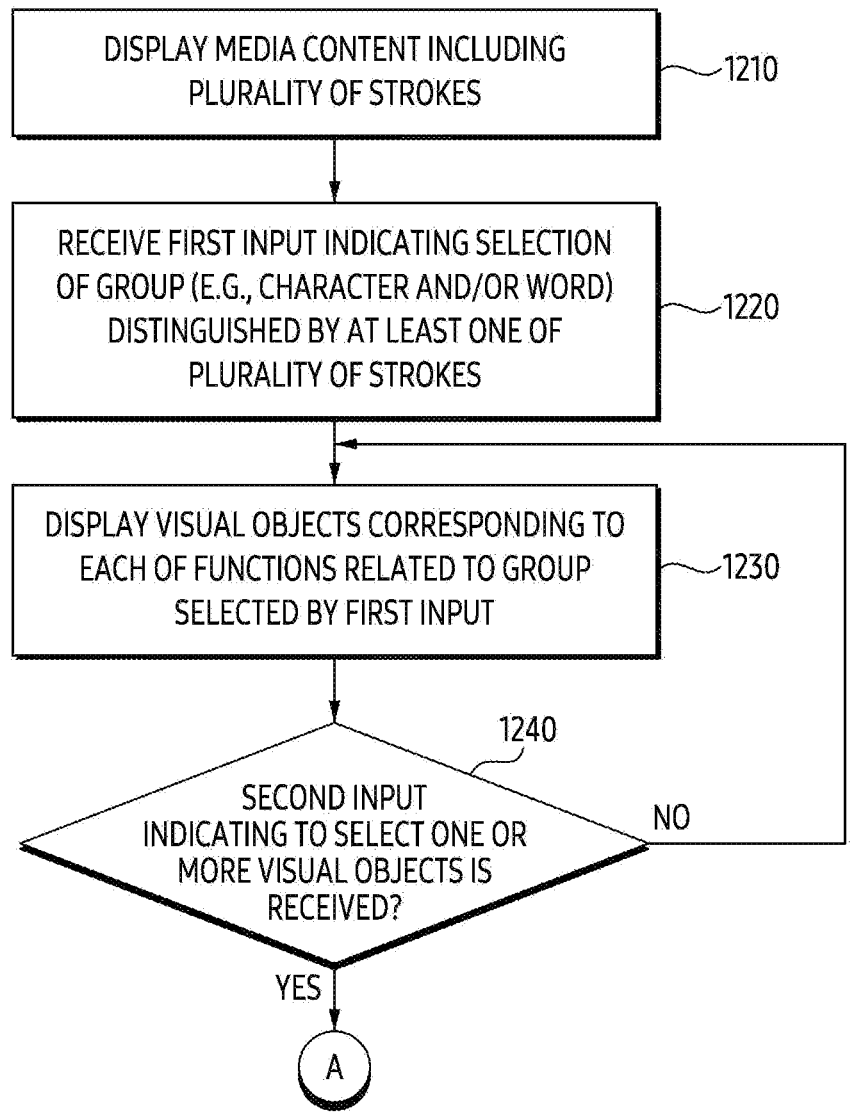
FIGS. 12A to 12B illustrate an example of a flowchart for describing an operation performed by an electronic device based on an input received from a user, according to an embodiment.
Figure 12B:
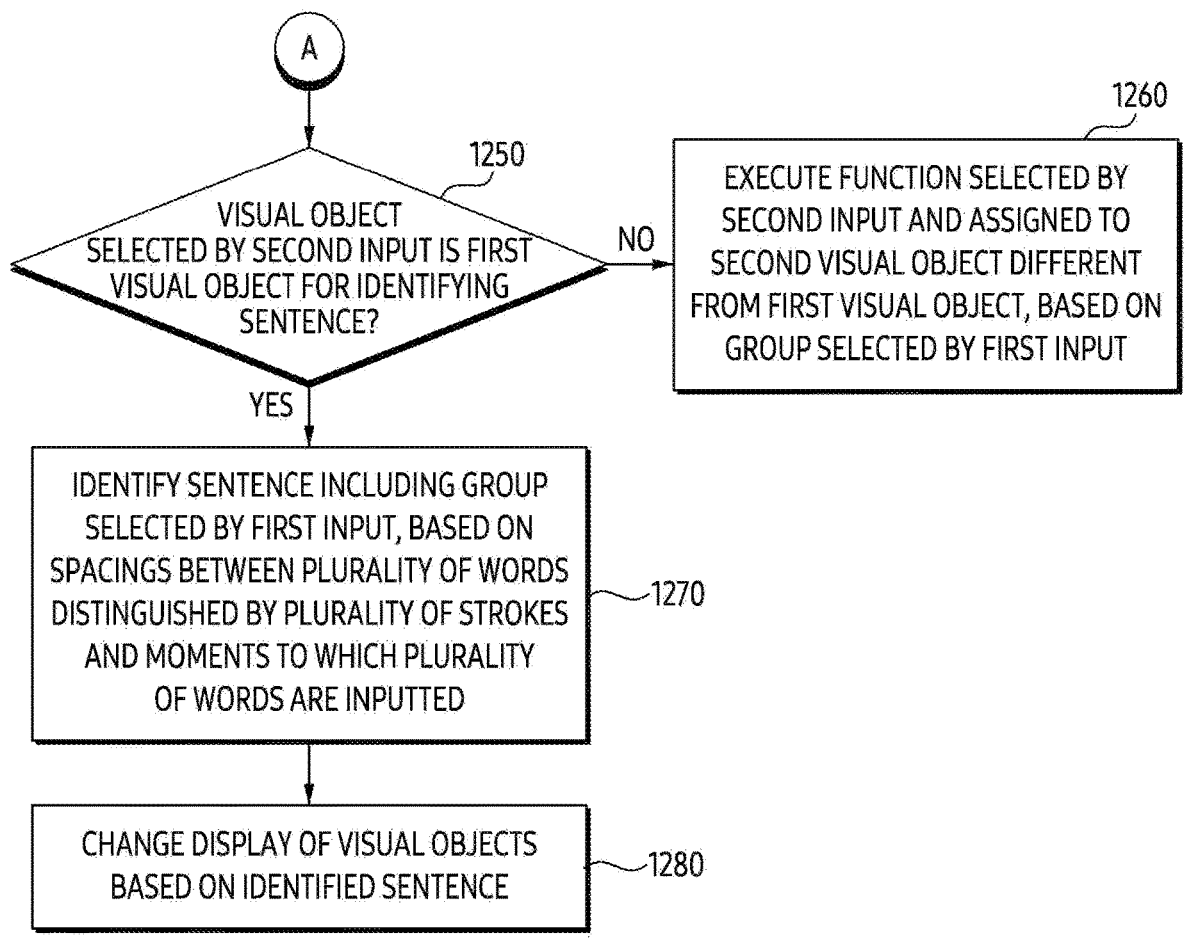

FIGS. 12A to 12B illustrate an example of a flowchart for describing an operation performed by an electronic device based on an input received from a user, according to an embodiment. The electronic devices of FIGS. 12A to 12B may include the electronic devices of FIGS. 1 to 11. For example, at least one of the operations of FIGS. 12A to 12B may be performed by the electronic device 101 and/or the processor 120 of FIG. 3. At least one of the operations of FIGS. 12A to 12B may be related to at least one of the operations of FIG. 11.

Referring to FIG. 12A, in operation 1210, according to an embodiment, the electronic device may display media content including a plurality of strokes. For example, the electronic device may display at least a part of the media content in a display (e.g., the display 210 of FIG. 3). The electronic device may display the plurality of strokes in the display, based on information including moments and positions to which each of the plurality of strokes is inputted, and identified from the media content.

Referring to FIG. 12A, in operation 1220, according to an embodiment, the electronic device may receive a first input indicating selection of a group (e.g., character, and/or word) distinguished by at least one of a plurality of stroke. The first input may include a gesture illustrated with reference to FIGS. 8A to 8C, 9A to 9B, and/or 10.

Referring to FIG. 12A, in operation 1230, according to an embodiment, the electronic device may display visual objects corresponding to each of functions related to the group identified by the first input. The visual objects may be displayed based on a list of the functions, such as the menu 914 of FIG. 9A. In operation 1230, the electronic device may display a first visual object for identifying a sentence including at least one character selected by the first input, as shown in the visual object 915 of FIG. 9A.

Referring to FIG. 12A, in operation 1240, according to an embodiment, the electronic device may determine whether a second input indicating to select one or more visual objects in operation 1230 is received. In response to not receiving a second input (1240-NO) to select one or more visual objects, the electronic device may maintain displaying the visual objects based on operation 1230.

Referring to FIG. 12B, in operation 1250 in response to receiving the second input of operation 1240 (1240-YES), according to an embodiment, the electronic device may determine whether the visual object identified by the second input is a first visual object for selecting a sentence. When the visual object identified by the second input is not the first visual object (1250-NO), in operation 1260, according to an embodiment, the electronic device may execute a function identified by a second input and assigned to a second visual object different from the first visual object, based on the group selected by the first input. For example, the second visual object may be mapped to functions (e.g., copy and/or crop) for extracting text represented by a group (e.g., character and/or word) selected by the first input.

When the visual object identified by the second input is the first visual object (1250-YES), in operation 1270, according to an embodiment, the electronic device may identify a sentence including a group identified by the first input, based on spacings between a plurality of words distinguished by a plurality of strokes, and based on moments to which a plurality of words are inputted. Identifying the sentence by the electronic device may be performed based on at least one of the operations of FIG. 11. For example, in response to the second input when the first word is identified by the first input, the electronic device may identify strokes included in the sentence including the first word, based on spacing between the first word and a second word different from the first word and moments to which a plurality of words including the first word and the second word are inputted.

Referring to FIG. 12B, in operation 1280, according to an embodiment, the electronic device may change the display of visual objects in operation 1230 based on the identified sentence. For example, the electronic device may cease displaying the first visual object that was being displayed based on operation 1230. Changing the display of visual objects in operation 1230 may include displaying a visual object indicating that the strokes included in the sentence are identified or selected.

Figure 13:
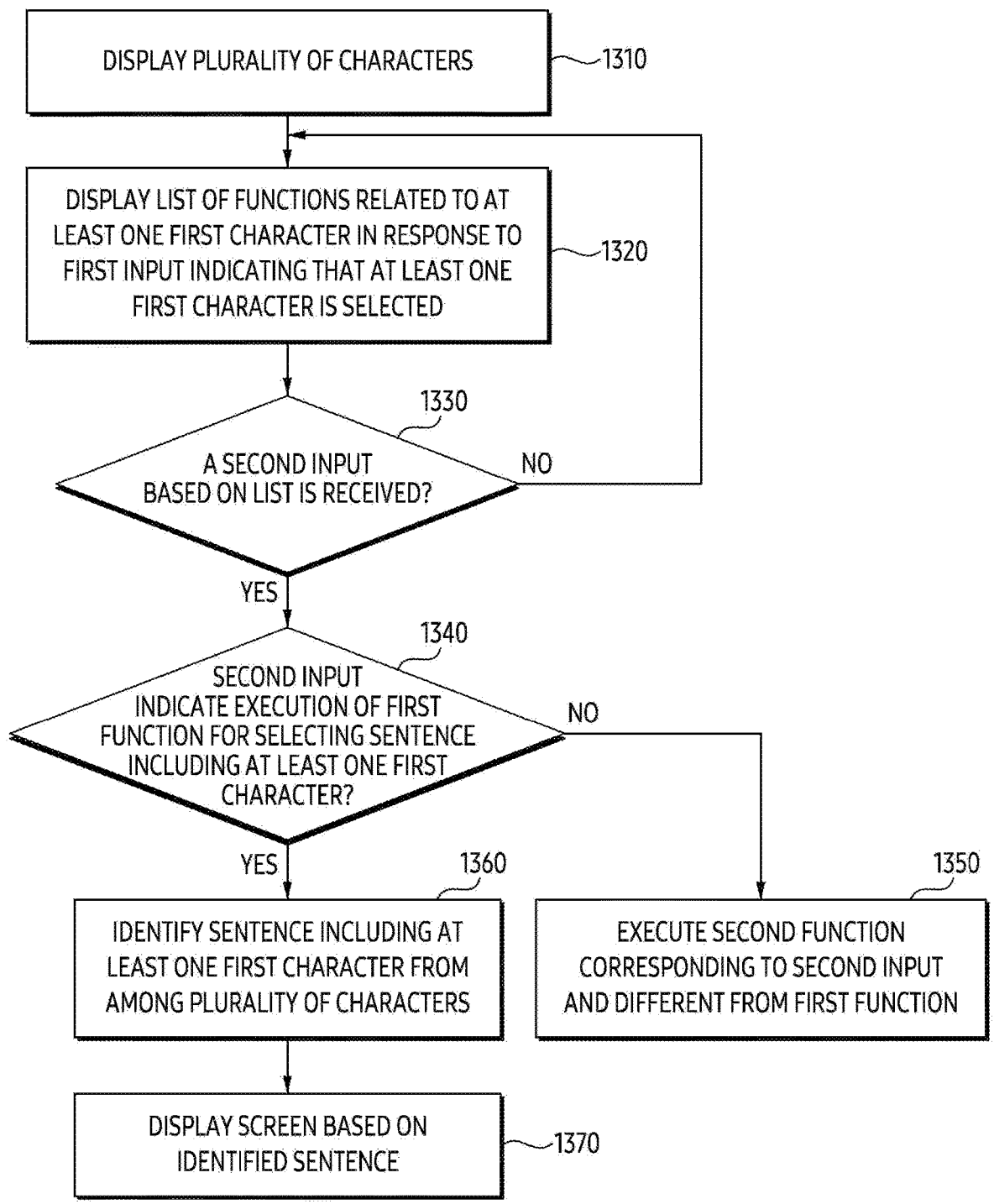
FIG. 13 illustrates an example of a flowchart for describing an operation performed by an electronic device based on an input received from a user, according to an embodiment.

FIG. 13 illustrates an example of a flowchart for describing an operation performed by an electronic device based on an input received from a user, according to an embodiment. The electronic device of FIG. 13 may include the electronic device of FIGS. 1 to 11 and/or the electronic device of FIGS. 12A to 12B. For example, at least one of the operations of FIG. 13 may be performed by the electronic device 101 and/or the processor 120 of FIG. 3. At least one of the operations of FIG. 13 may be related to at least one of the operations of FIGS. 11 and/or 12A to 12B.

Referring to FIG. 13, in operation 1310, according to an embodiment, the electronic device may display a plurality of characters. The operation 1310 of FIG. 13 may be performed similarly to the operation 1210 of FIG. 12. For example, the electronic device may display the plurality of characters distinguished by strokes included in the media content.

Referring to FIG. 13, in operation 1320, according to an embodiment, the electronic device may display a list of functions related to at least one first character in response to a first input indicating that at least one first character is selected. The first input may be identified based on a gesture related to the at least one first character among characters displayed by operation 1310. The list may include the menu 914 of FIG. 9A.

Referring to FIG. 13, in operation 1330, according to an embodiment, the electronic device may determine whether a second input based on the list is received. In response to not receiving a second input (1330-NO) based on the list, the electronic device may maintain displaying the list based on operation 1320.

In operation 1340 in response to receiving the second input (1330-YES), according to an embodiment, the electronic device may determine whether the second input indicates execution of the first function for identifying a sentence including at least one first character. When the second input indicates the execution of the second function different from the first function (1340-NO), in operation 1350, according to an embodiment, the electronic device may execute a second function corresponding to the second input and different from the first function. The second function may be related to a text corresponding to the at least one first character. The second function may correspond to other visual objects different from the visual object 915 for identifying a sentence in the menu 914 of FIG. 9A.

When the second input indicates the execution of the first function (1340-YES), in operation 1360, according to an embodiment, the electronic device may identify a sentence including at least one first character from among a plurality of characters. Identifying the sentence by the electronic device may be performed based on the execution of the sentence selector 340 of FIG. 3. For example, the electronic device may identify other inputted characters temporarily and spatially adjacent to at least one first character among the plurality of characters. Identifying the other characters by the electronic device may be performed based on operations of FIG. 11 and/or operation 1270 of FIG. 12B.

Referring to FIG. 13, in operation 1370, according to an embodiment, the electronic device may display a screen based on the identified sentence. For example, the electronic device may visualize that a sentence identified in the screen is selected, such as the state 830 of FIG. 8C, the state 920 of FIG. 9B, and/or the state 1010 of FIG. 10. The electronic device may display a visual object (e.g., the visual object 832 of FIG. 8C) surrounding the identified sentence. The electronic device may display the identified sentence in a color different from other sentences. Based on operation 1370, the electronic device may highlight multimedia content related to the identified sentence within the media content.

As described above, according to an embodiment, the electronic device may display media content including handwriting represented by a plurality of strokes. In response to an input indicating that at least one stroke is selected (e.g., an input indicating that the character and/or word distinguished by at least one stroke is selected), the electronic device may display a visual object for executing a function for identifying a sentence including the at least one stroke. In response to another input indicating that the visual object is selected, the electronic device may identify a sentence including the at least one stroke, based on the temporal information and/or spatial information of the words distinguished by the plurality of strokes.

A method for identifying one or more sentences from strokes representing handwriting may be required.

As described above, according to an embodiment, an electronic device 101 may comprise a display 210 and a processor 120. The processor may be configured to display a plurality of strokes 514 and 512 in the display. The processor may be configured to display, in response to a first input indicating selection of at least one character 510 distinguished by the plurality of strokes, a first visual object 915 for identifying a first sentence 242 including the at least one character. The processor may be configured to identify, in response to a second input indicating selection of the first visual object, strokes included in the first sentence among the plurality of strokes, based on a spacing 613 between a first word 242-3 including the at least one character and a second word 242-2, and based on moments of a plurality of words are inputted including the first word and the second word. The processor may be configured to display, in the display based on identification of the strokes included in the first sentence, a second visual object 832 corresponding to the identified strokes among the plurality of strokes. According to an embodiment, the electronic device may identify one or more sentences from strokes representing handwriting. According to an embodiment, the electronic device may provide a function of identifying strokes representing handwriting in a unit of sentence.

For example, the processor may be configured to identify, based on information for indicating at least one of a sequence in which the plurality of words are inputted, indicated by the moments or locations of the plurality of words, the strokes included in the first sentence.

For example, the processors may be configured to obtain, by using the information, sets including at least one of the plurality of words and probabilities that the sets are a single sentence. The processors may be configured to identify, based on the obtained probabilities, one or more words included in the first sentence including the first word among the plurality of words.

For example, the processors may be configured to obtain, by using a model trained based on a set of strokes corresponding to a single sentence, the probabilities.

For example, the processors may be configured to obtain, among the plurality of words, the spacing between the first word and the second word connected to the first word in the sequence. The processors may be configured to identify, based on at least one of difference between a first moment when the first word is inputted and a second moment when the second word is inputted, or the obtained spacing, whether the second word is included in a second sentence different from the first sentence.

For example, the processors may be configured to identify, based on identifying the first word and the second word included in a first line formed along a first direction where characters distinguished by the plurality of strokes are arranged, a spacing between the first word and the second word in the first direction.

For example, the processors may be configured to identify, based on identifying the first word included in the first line formed along the first direction where characters distinguished by the plurality of strokes are arranged and the second word included in a second line parallel to the first line, a spacing between the first word and the second word in a second direction different from the first direction.

For example, the processors may be configured to display, with the first visual object in response to the first input, at least one third visual object for executing a function associated with at least one word selected by the first input.

For example, the at least one third visual object may be configured to execute the function independent from other characters different from the at least one character in the first sentence.

For example, the processors may be configured to identify, in response to the second input, at least one image 470 associated with the first sentence in a media content including the plurality of strokes. The processors may be configured to display, based on identifying the at least one image, the second visual object corresponding to the strokes included in the first sentence and the identified at least one image.

For example, the processors may be configured to identify, in response to the second input, an audio signal associated with the first sentence in the media content including the plurality of strokes. The processors may be configured to display, based on identifying the audio signal, the second visual object corresponding to the strokes included in the first sentence and a third visual object indicating the audio signal.

For example, the processors may be configured to display, based on information including moments and locations in which each of the plurality of strokes is inputted, the plurality of strokes in the display.

As described above, according to an embodiment, a method of an electronic device may comprise displaying 1310, in a display of the electronic device, a plurality of characters. The method may comprise displaying 1320, in response to a first input indicating selection of at least one first character among the plurality of characters, a list of functions associated with the at least one first character. The method may comprise identifying 1360, in response to a second input indicating selection of a first function for identifying a sentence including the at least one first character that is identified based on the list, the sentence including the at least one first character among the plurality of characters. The method may comprise displaying, based on identifying of the sentence, at least one visual object in association with a plurality of second characters included in the sentence and including the at least one first character.

For example, the displaying the at least one visual object may comprise displaying a list of functions associated with the sentence indicated by the plurality of second characters, independently of a visual object for executing the first function.

For example, the displaying the list may comprise displaying, with the first visual object for executing the first function, at least one of a second visual object for executing a second function for copying the at least one first character selected by the first input, or a third visual object for executing a third function for extracting the at least one first character from a plurality of characters displayed in the display.

For example, the method may comprise at least temporarily storing, in response to a third input for selecting the second visual object, the at least one first character identified by the first input in a memory of the electronic device.

For example, the identifying may comprise identifying, based on spacings between the plurality of characters and a difference between moments when each of the plurality of characters are inputted, the sentence.

For example, the displaying the plurality of characters may comprise displaying, based on information indicating a plurality of strokes sequentially drawn by a user, the plurality of characters distinguished by the plurality of strokes.

For example, the displaying the at least one visual object may comprise displaying, in a media content including the plurality of characters, the at least one visual object for highlighting at least one of image, video, or audio associated with the identified sentence.

As described above, according to an embodiment, a method of an electronic device may comprise displaying a plurality of strokes in a display of the electronic device. The method may comprise displaying, in response to a first input indicating selection of at least one character distinguished by the plurality of strokes, a first visual object for identifying a first sentence including the at least one character. The method may comprise identifying, in response to a second input indicating selection of the first visual object, strokes included in the first sentence among the plurality of strokes, based on a spacing between a first word including the at least one character and a second word, and based on moments of a plurality of words are inputted including the first word and the second word. The method may comprise displaying, in the display based on identification of the strokes included in the first sentence, a second visual object corresponding to of the identified strokes among the plurality of strokes.

For example, the identifying may comprise identifying, based on information for indicating at least one of a sequence in which the plurality of words are inputted, indicated by the moments or locations of the plurality of words, the strokes included in the first sentence.

For example, the identifying may comprise obtaining, by using the information, sets including at least one of the plurality of words and probabilities that the sets are a single sentence. The identifying may comprise identifying, based on the obtained probabilities, one or more words included in the first sentence including the first word among the plurality of words.

For example, the obtaining the probabilities may comprise obtaining, by using a model trained based on a set of strokes corresponding to a single sentence, the probabilities.

For example, the identifying may comprise obtaining, among the plurality of words, the spacing between the first word and the second word connected to the first word in the sequence. The identifying may comprise identifying, based on at least one of difference between a first moment when the first word is inputted and a second moment when the second word is inputted, or the obtained spacing, whether the second word is included in a second sentence different from the first sentence.

For example, the identifying may comprise identifying, based on identifying the first word and the second word included in a first line formed along a first direction where characters distinguished by the plurality of strokes are arranged, a spacing between the first word and the second word in the first direction.

For example, the identifying may comprise identifying, based on identifying the first word included in the first line formed along the first direction where characters distinguished by the plurality of strokes are arranged, and the second word included in a second line parallel to the first line, a spacing between the first word and the second word in a second direction different from the first direction.

For example, the method may further comprise displaying, with the first visual object in response to the first input, at least one third visual object for executing a function associated with at least one word selected by the first input. The at least one third visual object may be configured to execute the function independent from other characters different from the at least one character in the first sentence.

For example, the displaying the second visual object may comprise identifying, in response to the second input, at least one image associated with the first sentence in a media content including the plurality of strokes. The displaying the second visual object may comprise displaying, based on identifying the at least one image, the second visual object corresponding to the strokes included in the first sentence, and the identified at least one image.

For example, the displaying the second visual object may comprise identifying, in response to the second input, an audio signal associated with the first sentence in the media content including the plurality of strokes. The displaying the second visual object may comprise displaying, based on identifying the audio signal, the second visual object corresponding to the strokes included in the first sentence, and a third visual object indicating the audio signal.

For example, the displaying the plurality of strokes may comprise displaying, based on information including moments and locations in which each of the plurality of strokes is inputted, the plurality of strokes in the display.

As described above, according to an embodiment, an electronic device 101 may comprise a display 210 and a processor 120. The processor may be configured to display, in the display, a plurality of characters. The processor may be configured to display, in response to a first input indicating selection of at least one first character among the plurality of characters, a list of functions associated with the at least one first character. The processor may be configured to identify, in response to a second input indicating selection of a first function for identifying a sentence including the at least one first character that is identified based on the list, the sentence including the at least one first character among the plurality of characters. The processor may be configured to display, based on identifying of the sentence, at least one visual object in association with a plurality of second characters included in the sentence and including the at least one first character.

For example, the processor may be configured to display a list of functions associated with the sentence indicated by the plurality of second characters, independently of a visual object for executing the first function.

For example, the processor may be configured to display, with the first visual object for executing the first function, at least one of a second visual object for executing a second function for copying the at least one first character selected by the first input, or a third visual object for executing a third function for extracting the at least one first character from a plurality of characters displayed in the display.

For example, the electronic device may further comprise a memory 130. The processor may be configured to store at least temporarily, in response to a third input for selecting the second visual object, the at least one first character identified by the first input in a memory of the electronic device.

For example, the processor may be configured to identify, based on spacings between the plurality of characters and a difference between moments when each of the plurality of characters are inputted, the sentence.

For example, the processor may be configured to display, based on information indicating a plurality of strokes sequentially drawn by a user, the plurality of characters distinguished by the plurality of strokes.

For example, the processor may be configured to display, in a media content 460 including the plurality of characters, the at least one visual object for highlighting at least one of image, video, or audio associated with the identified sentence.

The apparatus described above may be implemented as a combination of hardware components, software components, and/or hardware components and software components. For example, the devices and components described in the embodiments may be implemented using one or more general purpose computers or special purpose computers such as processors, controllers, arithmetical logic unit (ALU), digital signal processor, microcomputers, field programmable gate array (FPGA), PLU (programmable logic unit), microprocessor, any other device capable of executing and responding to instructions. The processing device may perform an operating system OS and one or more software applications performed on the operating system. In addition, the processing device may access, store, manipulate, process, and generate data in response to execution of the software. For convenience of understanding, although one processing device may be described as being used, a person skilled in the art may see that the processing device may include a plurality of processing elements and/or a plurality of types of processing elements. For example, the processing device may include a plurality of processors or one processor and one controller. In addition, other processing configurations, such as a parallel processor, are also possible.

The software may include a computer program, code, instruction, or a combination of one or more of them and configure the processing device to operate as desired or command the processing device independently or in combination. Software and/or data may be embodied in any type of machine, component, physical device, computer storage medium, or device to be interpreted by a processing device or to provide instructions or data to the processing device. The software may be distributed on a networked computer system and stored or executed in a distributed manner Software and data may be stored in one or more computer-readable recording media.

The method according to the embodiment may be implemented in the form of program instructions that may be performed through various computer means and recorded in a computer-readable medium. In this case, the medium may continuously store a computer-executable program or temporarily store the program for execution or download. In addition, the medium may be a variety of recording means or storage means in which a single or several hardware are combined and is not limited to media directly connected to any computer system and may be distributed on the network. Examples of media may include magnetic media such as hard disks, floppy disks and magnetic tapes, optical recording media such as CD-ROMs and DVDs, magneto-optical media such as floppy disks, ROMs, RAMs, flash memories, and the like to store program instructions. Examples of other media include app stores that distribute applications, sites that supply or distribute various software, and recording media or storage media managed by servers.

Although embodiments have been described according to limited embodiments and drawings as above, various modifications and modifications are possible from the above description to those of ordinary skill in the art. For example, even if the described techniques are performed in a different order from the described method, and/or components such as the described system, structure, device, circuit, etc. are combined or combined in a different form from the described method or are substituted or substituted by other components or equivalents, appropriate results may be achieved.

Therefore, other implementations, other embodiments, and equivalents to the claims fall within the scope of the claims to be described later.

What is claimed is:
1. An electronic device, comprising:
a display; and
a processor,
memory comprising instructions that, when executed by the processor, cause the electronic device to:
display a plurality of strokes and an image in the display;

display, in response to a first input indicating selection of at least one character distinguished by the plurality of strokes, a first visual object for identifying a first sentence including the at least one character;

identify, in response to a second input indicating selection of the first visual object, strokes included in the first sentence among the plurality of strokes, based on a spacing between a first word including the at least one character and a second word, and based on moments a plurality of words are inputted, the plurality of words including the first word and the second word;

display, in the display based on identification of the strokes included in the first sentence, a second visual object corresponding to the strokes identified among the plurality of strokes;

in response to receiving a selection of the first sentence, search media content being displayed; and in response to identifying that the first sentence selected is related to the image, display an additional visual object that includes a combination of the first sentence selected and the image.

2. The electronic device of claim 1, wherein the processor is configured to:

identify the strokes included in the first sentence, based on information for indicating a sequence in which the plurality of words is inputted, wherein the sequence is indicated by the moments or locations of the plurality of words.

3. The electronic device of claim 2, wherein the processor is configured to:

obtain, by using the information, sets including at least one of the plurality of words and probabilities that the sets are a single sentence; and identify, based on the probabilities obtained, one or more words included in the first sentence including the first word among the plurality of words.

4. The electronic device of claim 3, wherein the processor is configured to:

obtain, by using a model trained based on a set of strokes corresponding to a single sentence, the probabilities.

5. The electronic device of claim 2, wherein the processor is configured to:

obtain, among the plurality of words, the spacing between the first word and the second word connected to the first word in the sequence; and identify, based on at least one of a difference between a first moment when the first word is inputted and a second moment when the second word is inputted, or the spacing, whether the second word is included in a second sentence different from the first sentence.

6. The electronic device of claim 1, wherein the processor is configured to:

identify, based on identifying the first word and the second word included in a first line formed along a first direction where characters distinguished by the plurality of strokes are arranged, the spacing between the first word and the second word in the first direction.

7. The electronic device of claim 1, wherein the processor is configured to:

identify, based on identifying the first word included in the first line formed along the first direction where characters distinguished by the plurality of strokes are arranged and the second word included in a second line parallel to the first line, another spacing between the first word and the second word in a second direction different from the first direction.

8. The electronic device of claim 1, wherein the processor is configured to:

display, with the first visual object in response to the first input, at least one third visual object for executing a function associated with at least one word selected by the first input.

9. The electronic device of claim 8, wherein the at least one third visual object is configured to:

execute the function independent from other characters different from the at least one character in the first sentence.

10. The electronic device of claim 1, wherein the processor is configured to:

identify, in response to the second input, the image associated with the first sentence in the media content including the plurality of strokes; and display, based on identifying the image, the second visual object corresponding to the strokes included in the first sentence and the image identified.

11. The electronic device of claim 1, wherein the processor is configured to:

identify, in response to the second input, an audio signal associated with the first sentence in the media content including the plurality of strokes; and display, based on identifying the audio signal, the second visual object corresponding to the strokes included in the first sentence and a third visual object indicating the audio signal.

12. The electronic device of claim 1, wherein the processor is configured to:

display, based on information including particular moments and particular locations in which each of the plurality of strokes is inputted, the plurality of strokes in the display.

13. A method of an electronic device, comprising:

displaying, in a display of the electronic device, a plurality of characters and an image;

displaying, in response to a first input indicating selection of at least one first character among the plurality of characters, a list of functions associated with the at least one first character;

identifying, in response to a second input indicating selection of a first function for identifying a sentence including the at least one first character that is identified based on the list, the sentence including the at least one first character among the plurality of characters;

displaying, based on identifying of the sentence, at least one visual object in association with a plurality of second characters included in the sentence and including the at least one first character;

in response to receiving a selection of the sentence, searching media content being displayed; and in response to identifying that the sentence selected is related to the image, displaying an additional visual object that includes a combination of the first sentence selected and the image.

14. The method of claim 13, wherein the displaying the at least one visual object comprises:

displaying another list of functions associated with the sentence indicated by the plurality of second characters, independently of a first visual object for executing the first function.

15. The method of claim 13, wherein the displaying the another list comprises:

displaying, with the first visual object for executing the first function, at least one of a second visual object for executing a second function for copying the at least one first character selected by the first input, or a third visual object for executing a third function for extracting the at least one first character from the plurality of characters displayed in the display.

16. The method of claim 15, further comprising:
at least temporarily storing, in response to a third input for selecting the second visual object, the at least one first character selected by the first input in a memory of the electronic device.

17. The method of claim 13, wherein the identifying comprises:
identifying the sentence, based on spacings between the plurality of characters and a difference between moments when each of the plurality of characters are inputted.

18. The method of claim 13, wherein the displaying the plurality of characters comprises:
displaying, based on information indicating a plurality of strokes sequentially drawn by a user, the plurality of characters distinguished by the plurality of strokes.

19. The method of claim 13, wherein the displaying the at least one visual object comprises:
displaying, in the media content including the plurality of characters, the at least one visual object for highlighting at least one of the image, video, or audio associated with the sentence identified.

20. A method of an electronic device, comprising:
displaying a plurality of strokes in a display of the electronic device;
displaying, in response to a first input indicating selection of at least one character distinguished by the plurality of strokes, a first visual object for identifying a first sentence including the at least one character;
identifying, in response to a second input indicating selection of the first visual object, strokes included in the first sentence among the plurality of strokes, based on a spacing between a first word including the at least one character and a second word, and based on moments a plurality of words are inputted, the plurality of words including the first word, and the second word;
displaying, in the display based on identification of the strokes included in the first sentence, a second visual object corresponding to the strokes identified among the plurality of strokes;
in response to receiving a selection of the first sentence, searching media content being displayed; and
in response to identifying that the first sentence selected is related to the image, displaying an additional visual object that includes a combination of the first sentence selected and the image.

* * * * *